United States Patent [19]
Weber et al.

[11] Patent Number: 6,113,644
[45] Date of Patent: *Sep. 5, 2000

[54] METHOD AND SYSTEM FOR VEHICLE DESIGN USING OCCUPANT REACH ZONES

[75] Inventors: William Francis Weber, Bloomfield Hills; Daniel Cornelius Bach, Belleville; Joseph J. Moon, Livonia; Frederick Abraham Karam, Allen Park; Sean James Sevrence, Temperance; Scott Ming-Hua Tang; Michael Joseph Walraven, both of Ypsilanti; Mark Russell Henault, Milford, all of Mich.

[73] Assignee: Ford Global Technologies, Inc., Dearborn, Mich.

[ * ] Notice: This patent is subject to a terminal disclaimer.

[21] Appl. No.: 08/984,806

[22] Filed: Dec. 4, 1997
(Under 37 CFR 1.47)

[51] Int. Cl.[7] .............................. G06F 17/50; G06F 9/455

[52] U.S. Cl. ................................... 703/8; 703/1; 345/419

[58] Field of Search ........................ 395/500.01, 500.37, 395/500.29; 345/333, 348, 353, 356, 419, 473, 339, 355; 264/148.01, 149, 150, 151, 152, 468.01, 468.02, 468.03, 468.04, 468.09, 468.1, 468.12; 180/271, 286, 287; 280/1; 434/29, 257, 267, 365, 370, 373; 382/104

[56] References Cited

U.S. PATENT DOCUMENTS

| | | | |
|---|---|---|---|
| 4,439,824 | 3/1984 | Mayer ........................................ | 700/30 |
| 4,625,329 | 11/1986 | Ishikawa et al. ........................ | 382/104 |
| 4,811,240 | 3/1989 | Ballou et al. ............................ | 345/334 |
| 4,912,657 | 3/1990 | Saxton .................................... | 345/356 |
| 5,033,014 | 7/1991 | Carver et al. ............................... | 703/1 |

(List continued on next page.)

FOREIGN PATENT DOCUMENTS

| | | |
|---|---|---|
| 0 401 900 A1 | 5/1990 | European Pat. Off. . |
| 2 240 414 | 12/1990 | United Kingdom . |

OTHER PUBLICATIONS

INSPEC Acc. No. 1816358, SAMMIE: A Computer Aid for Man Machine Modelling, 8th Annual Conference on Computer Graphics and Interactive Techniques, Computer Graphics, Aug. 1981, vol. 15, No. 3, pp. 163–169.

*Primary Examiner*—Kevin J. Teska
*Assistant Examiner*—Russell W. Frejd
*Attorney, Agent, or Firm*—David B. Kelley

[57] ABSTRACT

A computer based system and method orients an occupant representation, in electronic form, with respect to a three-dimensional electronic representation of a portion of the vehicle. At least one vehicle system is represented, also in electronic form, with respect to a common reference point, at least one human factors reach study is electronically performed to determine occupant reach with respect to the at least one vehicle system, and an outcome of that study is reported to a vehicle designer. The designer then has an option to vary, or alter, the vehicle, the occupant orientation, the location of the vehicle system, or any combination thereof, so that the design meets the reach criteria of the study. However, the designer may opt to retain the design despite non-compliance with the reach criteria. If a parameter change is made, the system and method automatically rebuild every other effected dimension, and vehicle systems to satisfy the regenerated design are automatically selected from an electronic parts library so that packaging alternatives can be quickly studied. A geometric representation of occupant reach relative to a vehicle system may be displayed to allow a designer to visually assess compliance with a particular reach criteria. The occupant representation, vehicle, vehicle system, and geometric representation of the occupant reach may be rendered and animated in three-dimensions permitting views from various perspectives. The method and system can quickly provide accurate human factors reach studies for a vehicle design while allowing system packaging flexibility.

76 Claims, 23 Drawing Sheets

(16 of 23 Drawing Sheet(s) Filed in Color)

U.S. PATENT DOCUMENTS

| | | | |
|---|---|---|---|
| 5,070,534 | 12/1991 | Lascelles et al. | 345/348 |
| 5,111,413 | 5/1992 | Lazansky et al. | 703/16 |
| 5,189,626 | 2/1993 | Colburn | 700/182 |
| 5,197,120 | 3/1993 | Saxton et al. | 345/439 |
| 5,293,479 | 3/1994 | Quintero et al. | 345/353 |
| 5,481,465 | 1/1996 | Itoh | 700/118 |
| 5,590,268 | 12/1996 | Doi et al. | 345/326 |
| 5,729,463 | 3/1998 | Koenig et al. | 700/98 |
| 5,761,063 | 6/1998 | Jannette et al. | 700/97 |
| 5,799,293 | 8/1998 | Kaepp | 706/45 |
| 5,844,554 | 12/1998 | Geller et al. | 345/333 |

OTHER PUBLICATIONS

F. Purschke et al., Virtual Reality—New Methods for Improving and Accelerating the Development Process in Vehicle Styling and Design, Computer Graphics International, 1998, pp. 789–797.

(List continued on next page.)

SAE J903c, Nov. 1973—"Passenger Car windshield Wiper Syhstems".

SAE J1052, May 1987—"Motor Vehicle Driver and Passenger Head Position".

SAE J100, Mar. 1988—"Passenger Car Glazing shade Bands".

SAE J287, Jun. 1988—"Driver Hand Control Reach".

SAE J1516, Mar. 1990—"Accommodation Tool Reference Point".

SAE J1517, Mar. 1990—"Driver Selected Seat Position".

SAE J1521, Mar. 1990—"Truck Driver Shin–Knee Position For Clutch and Accelerator".

SAE J1522, Mar. 1990—"Truck Driver Stomach Position".

SAE J826, Jun. 1992—"Devices for Use in Defining and Measuring Vehicle Seating Accommodation".

SAE J941, Jun. 1992—"Motor Vehicle Drivers' Eye Locations".

SAE J902, Apr. 1993—"Passenger Car Windshield Defrosting Systems".

SAE J198, Jun. 1993—"Winshield Wiper Systems—Trucks, Buses, and Multipurpose Vehicles".

SAE J1100, Jun. 1993—"Motor Vehicle Dimensions".

SAE J1050—Describing and Measuring the Driver's Field of View.

"Automating Design in Pro/Engineer with Pro/Program", Mark Henault, Sean Sevrence and Mike Walraven (Onword Press) 1997.

Chrysler Puts Comfort in the Front Seat with Ilog Tools (S. Alexander Internet Web Site http://www.infoworld.com/pageone/special/eccase042296.htm (Internet publication date unknown).

Inspec acc. No. 2832913, SAMMIE: a computer aided design tool for ergonomists, Proc. Human Factors Soc. 30th meeting, vol. 1, pp. 695–698, Dayton Ohio, Sep. 29—Oct. 3, 1986.

Inspec acc. No. 4408183, Use of ergonomic workspace modeling in vehicle design, CAES '92, pp. 145–152, 1992.

TECHMATH releases RAMSIS 3.4 Human–Modeling Software, at www.nasatech.com/NEWS/techmath_0119.html.

R.W. McLay et al., "Ergonomics, spinal injury, and industrial vehicle safety", Proceedings of the 1996 Fifteenth Southern Biomedical Engineering Conference, 1996, pp. 191–194.

S. Anono, "The Next Step in Automotive Electronic Control", International Congress on Transportation Electronics, 1988, Convergence 88, pp. 83–89.

M. Asano et al., "New Approach in Automotive Control—An Experiment Variable–Response Vehicle", 1991 International Conference on Industrial Electronics, Control and Instrumentation 1991, IECON '91, pp. 123–128.

P.A.J. Barham et al., "The Ergonomic and Safety Implicatios of In–Car ATT Devices—Evidence from Field Trials with Elderly Drivers", IEE Colloquium on Design of the Driver Interface, 1995, pp. Apr. 1–Apr. 3.

A. Pauzie et al., "Ergonomic Evaluation of a Prototype Guidance System in an Urban Area. Discussion about methodologies and data collection tools", Vehicle Navigation and Information Systems Conference, 1995. In Conjunction with the Pacific Rim TransTech Conference, 6th International VNIS, pp. 390–396.

J. L. Campbell, "Development of Human Factors Design Guidelines for Advanced Traveler Information Systems (ATIS)", Vehicle Navigation and Information Systems Conference, 1995, In Conjunction with the Pacific Rim TransTech Conference, 6th International VNIS, pp. 161–164.

J. Laird Evans et al., "In–Vehicle Man–Machine Interaction–the SOCRATES approach", Vehicle Navigation anf Information Systems Conference 1994, pp. 473–477.

T.S. Abbott et al., "Functional Catagories for Human–Centered Flight Deck Design", Digital Avionics Systems Conference, 1993, 12th DASC, AIAA/IEEE, pp. 66–74.

E.J. Hartzell et al., "Computational Human Factors in Human–Machine Engineering—The Army–NASA Aircrew/Aircraft Integration (A/sup Mar. 1) Program", Proceedings of the IEEE 1988 National Aerospace and Electronics Conference, 1988 NAECON 1988, pp. 819–822.

METHOD AND SYSTEM FOR VEHICLE DESIGN USING OCCUPANT REACH ZONES

FIELD OF THE INVENTION

The present invention relates to computer aided automotive vehicle design, in general, and more specifically to occupant reach based vehicle design.

BACKGROUND OF THE INVENTION

Vehicle design has advanced to a state in which occupant comfort and convenience, sometimes called ergonomics or human factors, is on at least an even par with the transportive aspects of a vehicle. This evolution has been driven by the availability of new technologies, including instrument panel clusters, adjustable steering wheels and columns, vehicle electronics, and movable seats, to mention only a few. With the addition of each new technology to the automotive vehicle environment, however, has come additional complexity in packaging the various occupant appurtenances to best achieve both design and ergonomic functionality.

One aspect of this packaging task is to provide an occupant, particularly a vehicle driver, with sufficient reach access for operation of vehicle controls. That is, a vehicle design goal is to position vehicle systems, such as radio controls, lighting controls, seat belts, a manual gear shift, and the like, within a seated occupant's reach without need for forward or backward adjustment. Current practice relies on various methods to determine whether a proposed design meets preferred reach requirements. Typically, a proposed design is analyzed in two-dimensions which requires many "cuts" of a drawing. A three-dimensional "buck" is also used to give a better overall view of the design, but such physical representations are expensive, time consuming, and difficult to modify for a subsequent design. Since there may be many individual components which affect occupant reach, the tasks associated with capturing all of the required human reach factors packaging requirements are daunting. For example, a single maximum push button study, which determines whether push button controls on the instrument panel are reachable by a given occupant, can require several hours to complete. In total, performing human factors reach studies typically requires many weeks under current practice, assuming the availability of experienced analysts to conduct all of the individual studies.

An additional problem with current design practice is that it leaves room for errors, due to the complex instructions required to perform the studies. Current design practice also is inflexible in that a change in one component, even a minor component, requires all human factors reach studies to be redone, resulting in greater expense and delay of design completion.

SUMMARY OF THE INVENTION

The present invention overcomes the deficiencies of current vehicle design practice by providing a method and system which can quickly provide accurate human factors reach studies for a vehicle design while allowing system packaging flexibility. The computer based system and method of the present invention orients an occupant representation, in electronic form, with respect to a three-dimensional electronic representation of a portion of the vehicle. At least one vehicle system is represented, also in electronic form, with respect to a common reference point. At least one human factors reach study is performed to determine occupant reach with respect to at least one vehicle system, and an outcome of that study is reported to a vehicle designer. The designer then has an option to vary, or alter, the occupant orientation, the location of the vehicle system, or both, so that the design meets the reach criteria of the study. However, the designer may opt to retain the design despite non-compliance with the reach criteria. If a parameter change is made, the system and method automatically rebuild every other effected dimension, and vehicle systems that satisfy the regenerated design are automatically selected from an electronic parts library so that packaging alternatives can be quickly studied. In addition, a geometric representation of occupant reach relative to a vehicle system may be displayed to allow a designer to visually assess compliance with a particular reach criteria. The occupant representation, vehicle, vehicle system, and geometric representation of the occupant reach may be rendered and animated in three-dimensions permitting views from various perspectives.

An advantage of the present invention is a method and system for vehicle design using human factors reach studies which considerably reduces vehicle design time and expense.

Another advantage of the present invention is a method and system for vehicle design which can be applied to any vehicle system, device, or component which interacts with a vehicle occupant.

Yet another advantage of the present invention is a method and system which can be applied to any vehicle system which an occupant must reach.

Still another advantage of the present invention is a vehicle design method and system which allows study of vehicle packaging feasibility early in the design process.

Another advantage of the present invention is a vehicle method and system which supports computer aided engineering (CAE) analysis and rapid prototyping.

Another advantage is a method and system for vehicle design which provides informed design decision making which supports vehicle program timing, and which reduces late design changes.

Yet another advantage of the present invention is a vehicle design system and method which provides flexibility in vehicle design while not being constrained by timing requirements imposed in traditional prototype design development.

Still yet another advantage is a vehicle design system and method which provides generic, ergonomically sound parametric automated design of various portions of a vehicle in light of predetermined occupant reach criteria.

A feature of the present invention is a vehicle design system and method which provides accelerated, three-dimensional solid modeling of automated reach studies in packaging of vehicle systems.

Another feature of the present invention is the ability of a vehicle designer to easily alter any factor with the result that the system and method automatically rebuild every other effected dimension so that packaging alternatives can be quickly studied.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
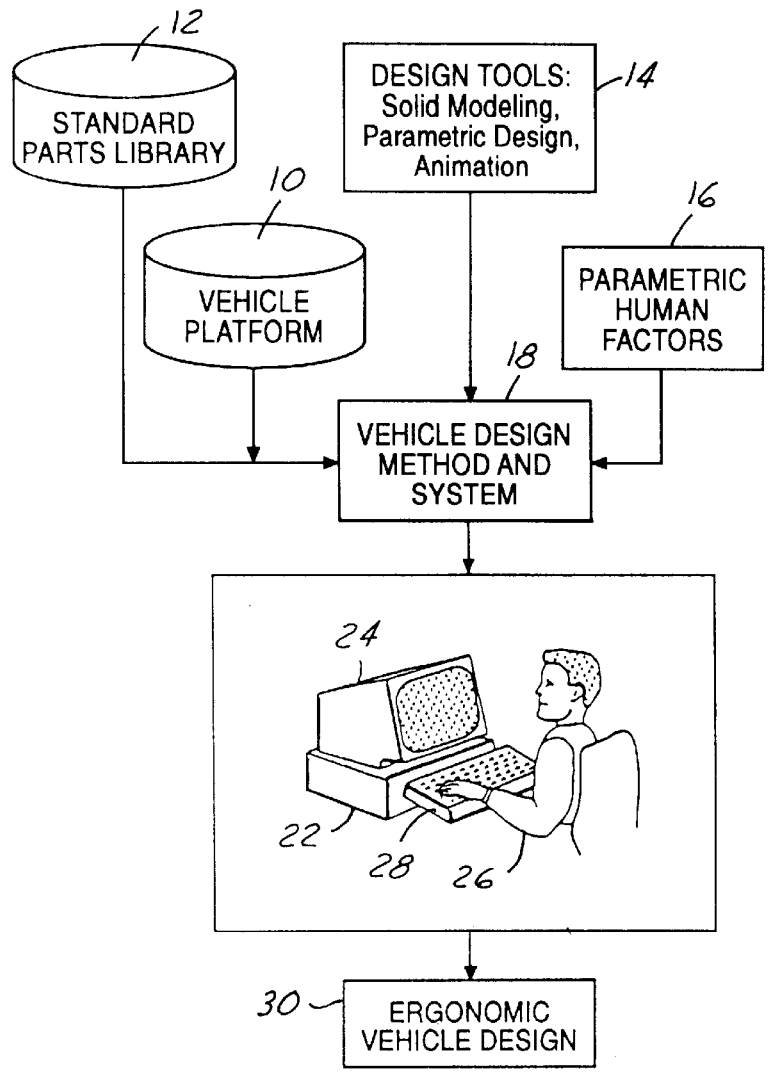
FIG. 1 is a flow chart illustrating various parts of a system for designing an automotive vehicle according to the present invention.

Automotive vehicle design, and in particular design with respect to occupant reach of a portion of an automobile, is achieved according to the present invention with a generic, parametric driven design process. This process allows flexibility in vehicle design, including performance of numerous ergonomic reach studies in a small fraction of the time required with conventional vehicle design. The present invention enables an acceptable design to be achieved in minutes, as opposed to days and weeks previously required. Various computer based tools are integrated to achieve this enormous time and expense savings, including solid modeling, parametric design, automated studies, and a non-parametric component library, sometimes called a standard parts library. Referring to FIG. 1, the tools used by the method and system of the present invention are shown graphically. Vehicle platforms are electronically represented on an electronic storage device 10, which includes representation of vehicle sheet metal, for example. A standard parts library 12, also stored on an electronic medium, has electronic representations of production parts, generic parts, and others. Packaging studies with these parts can be done to assess many factors, including the potential for reuse and complexity reduction. Various design tools, shown generally at 14, can be used for this packaging task. Solid modeling takes electronically stored vehicle platform data and standard parts data and builds complex geometry providing part-to-part or full assembly interference checking. Several commercial solid modeling programs are available and generally known to those skilled in the art, such as Pro/Engineer® and IDEAS®. Solid modeling also allows three-dimensional visualization through use of rendering and animation systems, such as Vislab®, while being compatible with other computer aided engineering and rapid prototyping computer applications.

Parametric design is used in the electronic construction of vehicle geometry within a computer for ergonomic reach studies of components and assemblies. As certain dimensions, or parameters, are modified, the computer is instructed to regenerate a new vehicle or part geometry. The parametric human factors reach studies, generally shown at box 16, control and limit the design process in accordance with ergonomically desirable parameters, as is further discussed below.

Still referring to FIG. 1, the computer implemented method and system of the present invention, shown at box 18, advantageously combines all of the foregoing to provide an efficient, flexible, rapid design for a vehicle, or a portion of a vehicle, which meets predefined ergonomic reach requirements. As seen in FIG. 1, the present invention is implemented on a computer system 22, including a processor and a memory, which can provide display and animation of vehicle, occupant, and vehicle part electronic representations on a display such as a video terminal 24. Parameter selection and control for the design method can be accomplished by a user 26 via a keyboard 28, or other user interaction device, such as a mouse or a SpaceBall™. One input method could include a pop-up window with all current parameters, including an on-line description for the parameter and a current value therefor. Other input methods will occur to those skilled in the art. For example, parametric values may be picked from a table within a two-dimensional mode since some vehicle designers prefer to view an assembly in sections which can be laid out on a drawing. A vehicle design 30 enhanced by ergonomic studies is an output of the current invention.

Figure 2:
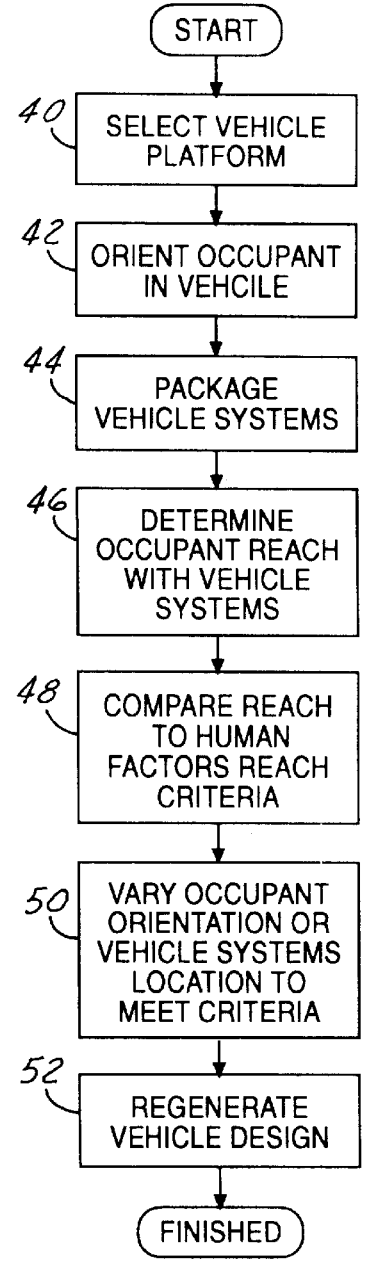
FIG. 2 is a flow chart of one embodiment of a method for designing a vehicle according to the present invention.
Figure 3:
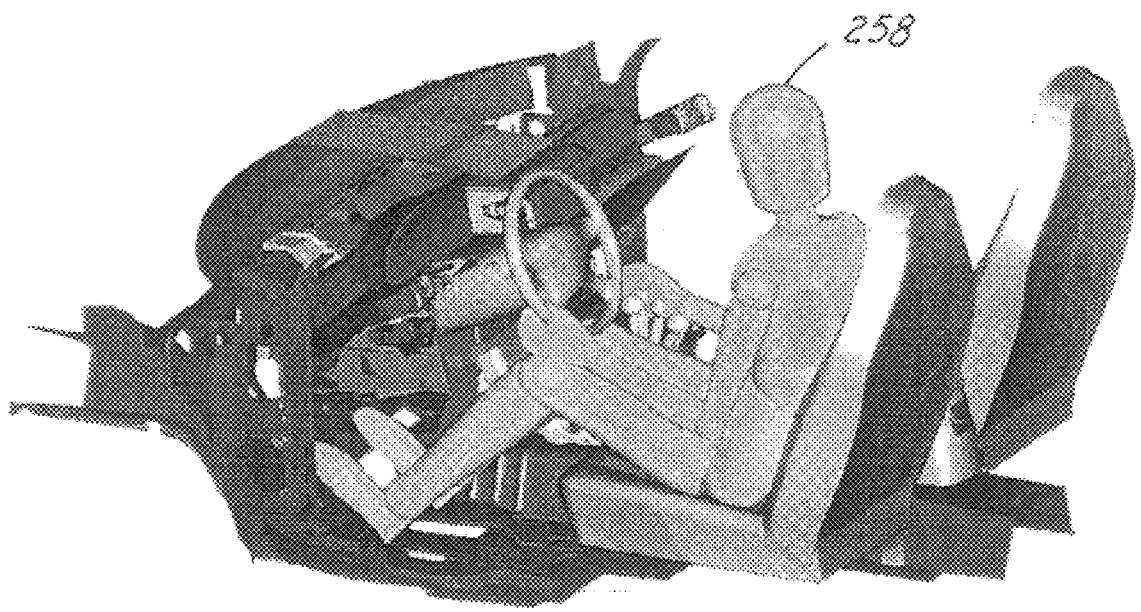
FIG. 3 is a color perspective view of a portion of an automotive vehicle having an occupant representation situated thereon representing a 95% male.

Turning to FIG. 2, a flowchart of a method according to the present invention is shown. In box 40 of FIG. 2, a vehicle platform is selected so that an electronic representation of vehicle sheet metal, including a floor plan, is available (FIG. 3). It should also be understood that use of the term vehicle in this disclosure implies an electronic representation of at least a portion of a vehicle, for example the floor pan sheet metal. Vehicle platform selection is optional, it being understood that occupant orientation and vehicle system packaging, as next described, need only be situated with respect to a common referenced point.

Figure 4:
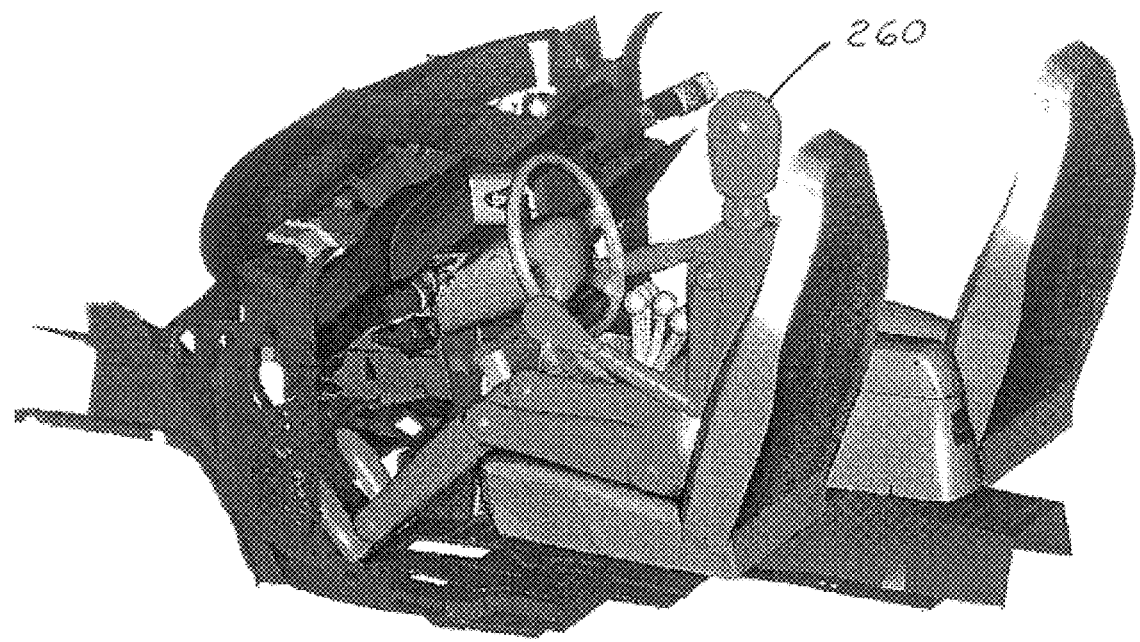
FIG. 4 is a color perspective view of a portion of an automotive vehicle having an occupant representation situated thereon representing a 5% female.

In box 42 of FIG. 2, an occupant representation is oriented in the vehicle. For purposes of this disclosure, orientation of an occupant means specifying or selecting values for a set of occupant position parameters which represent various occupant locations with respect to the vehicle. These occupant position parameters may include data for the three-dimensional location of an occupant hip point, a distance between an accelerator heel point and the occupant hip point, and occupant back angle. Selection of an occupant type, for example, may also be important so that occupant attributes, such as arm length and head height, are known. Various occupant types may be selected, including that for a 95% male 258 (FIG. 3) and the 5% female 260 (FIG. 4). Representation of an occupant in the form of a mannequin, as is done in many of the drawings herein disclosed, including FIGS. 3 and 4, is for user convenience only and is not necessary for operation of the method and system of the present invention. Rather, selection of certain occupant orientation parameters is all that is required. Those skilled in the art will recognize that other occupant position parameters may also be used, and that only one, or a combination of parameters, may be required to orient an occupant representation within the vehicle. Selection will depend on the particular human factors study to be performed.

After the occupant has been oriented as described above, various systems, devices, or components are then packaged on the vehicle. For purposes of this disclosure, packaged means that an electronic representation of the dimensions of the system, device, or component are geometrically related to the vehicle three-dimensional electronic reference frame, coordinate system, or reference point. These systems may include, but are not limited to, instrument panel clusters, electronic clusters, including radios, tape players, and CD's, heating, ventilation, and air conditioning (HVAC) control panels and outlet ducts, door trim, glove box, air bags, knee bolsters, a steering wheel and column, a center console, a manual shift device, and seats. Vehicle systems is intended to include any part of the vehicle which will interact with an occupant, either directly or indirectly. Those skilled in the art will recognize that the foregoing list is intended to be illustrative only and not exhaustive. It should also be understood that occupant orientation (box 42) and packaging of vehicle systems (box 44) need not be accomplished in the order indicated in FIG. 2, but can be done in reverse order, or intermingled, that is, various systems may be packaged, the occupant oriented within the vehicle, and other systems subsequently packaged.

After the occupant is oriented and the vehicle systems are initially packaged as described above, occupant reach with respect to various vehicle systems is then determined. Occupant reach may be determined in many ways, for example generating reach geometries, including distances, surfaces, and zones. The reach geometries may represent, but are not limited to, a maximum push-button reach, a maximum three-finger reach, a maximum full-hand grasp reach, a minimum reach, and steering wheel finger reach. The aforementioned occupant reach interactions are determined with the design tools described above, including solid modeling, parametric design and animation. Those skilled in the art will understand that other design tools may also be used to determine various occupant reach interactions with the vehicle systems.

Three dimensional geometric reach interaction, or lack of reach interaction, between an occupant and vehicle systems may be generated. These interactions may then be communicated to the user, such as by reporting or displaying. Animation on a video screen in three-dimensions with different colors representing various vehicle systems, occupant interactions, and occupant reach representations can be used to effectively communicate study results. However, a printed report of the occupant reach interaction, such as a dimensional distance between an occupant representation and a vehicle system, may be sufficient.

Still referring to FIG. 2, when occupant reach interactions have been determined, they may be compared to a set of human factors reach criteria, as shown in box 48. The human factors criteria comprise a set of data or information which specifies a preferred occupant reach interaction. Such reach criteria may include, for example, the requirement that all vehicle systems on an instrument panel center stack be within a three-finger grasp zone. Numerous other human factors reach criteria similar to the occupant reach interaction can be used in the comparison of box 48. The comparison may be done visually, such as viewing an occupant reach interaction from various perspectives of the vehicle, occupant, and vehicle systems. For example, reach surfaces may be displayed to show whether an occupant is able to reach, grasp, or push buttons on a radio positioned on the instrument panel. The surfaces so displayed form reach zones such that vehicle system controls, such as buttons, which are occupant accessible appear in an accessibility zone on an occupant side of the surface, while those controls which are inaccessible appear in an inaccessibility zone on an instrument panel side of the surface.

If an occupant reach interaction does not meet a corresponding human factors reach criteria, adjustment to the vehicle design can be made by varying the occupant orientation, the vehicle systems locations, or both, or any generic parameter, as shown in box 50 (FIG. 2). Adjustment of the various parameters may be non-iteratively performed, that is, a vehicle designer may change one or more of the parameters based on past design experience in a single step, or steps. Alternatively, the steps of FIG. 2 may be iteratively performed until an acceptable design is reached or a conclusion is made that such a design is not possible. Variation of the parameters may be conducted interactively through user 26 input (FIG. 1). It should be understood that variation of the occupant orientation or the vehicle systems is optional and that the human factors reach criteria may or may not be required to be met.

When a change is made to the occupant orientation, a vehicle system, or any design parameter, for example a locational change with respect to the chosen coordinate system, regeneration of the entire vehicle design is electronically performed (box 52 of FIG. 2). During this regeneration step, appropriate relationships between the occupant representation, the vehicle systems, and the vehicle are automatically determined, and vehicle systems are automatically changed according to the revised parameters. That is, the method and system of the present invention will automatically rebuild every other affected dimension so that packaging alternatives can be quickly studied. In the regeneration step, originally selected vehicle systems or devices may need replacement to fit with the new design. This replacement is automatically done by selection of vehicle systems or devices from the electronic parts library to meet the vehicle system change, for example a locational change. It should therefore be understood that some changes to a vehicle design are selected by a vehicle designer, as discussed above and further discussed below with respect to FIG. 13, while other changes are accomplished automatically by the system and method of the present invention to accommodate designer specified changes. This feature allows packaging alternatives to be quickly studied.

Figure 5:
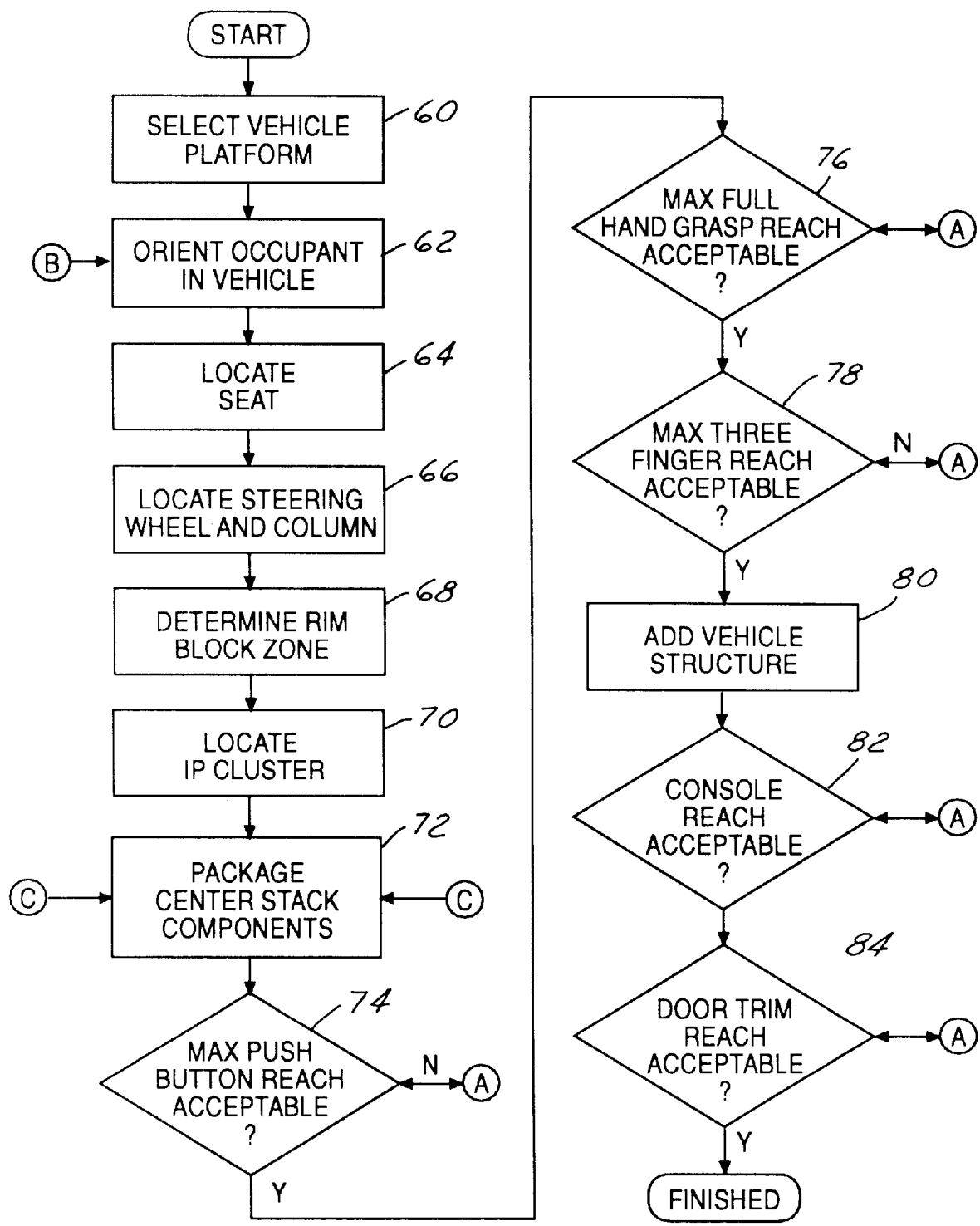
FIG. 5 is a flow chart of one detailed embodiment of a method for designing a vehicle according to the present invention.
Figure 6:
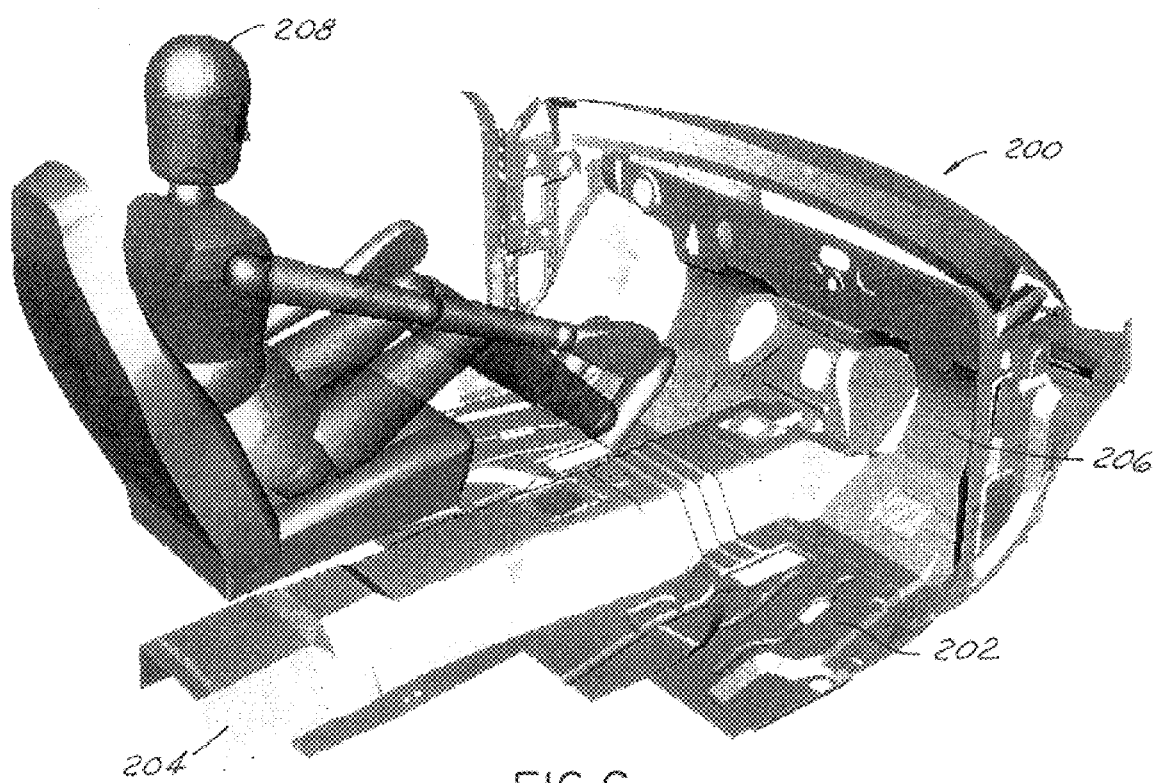
FIG. 6 is a color perspective view of a portion of an automotive vehicle showing an occupant representation oriented on a seat therein.

Turning now to FIG. 5, a detailed example of one embodiment of the method of the present invention is shown beginning at box 60. As seen in FIG. 6, a vehicle platform 200, shown in light gray, is selected to generate a three-dimensional, electronic representation of a floor pan 202, a transmission tunnel 204, and a front wall 206 (all shown in light gray). It should be understood that selection and display of the vehicle platform 200 shown in FIG. 6 is optional and not required for the method of the present invention. Selection of a vehicle platform may be from a list of vehicle platforms and will determine the three-dimensional coordinates of the platform in an electronic form as represented in the memory of the computer 22.

After selection of the vehicle platform, an occupant representation 208, shown in yellow in FIG. 6, is orientated in the vehicle as depicted in box 62 of FIG. 5. Orientation of the occupant representation 208 is accomplished as described above. This orientation includes selection of an occupant type which determines an occupant arm length, and thus an occupant reach. For example, selection of a 5% female occupant type determines a torso length between a hip point and a shoulder point for a female representing the smallest 5% of the female population, in addition to an arm length from the shoulder point to a hand point for such a female. A hand length can also be determined from the hand point to a finger point representing the end of the middle finger. Other relevant lengths can also be determined, including a three-finger grasp length and a full grasp length. These lengths are related to the vehicle reference frame, or to a common reference point, through the various occupant orientation parameters, for example, the occupant hip point.

In box 64 (FIG. 5), a seat 210 (orange, FIG. 6) is next located with respect to the vehicle platform 200 and the occupant representation 208, and the location of the seat 210 with respect to the occupant 208 will in part determine the type of seat which may be used in construction of the vehicle.

Figure 7:
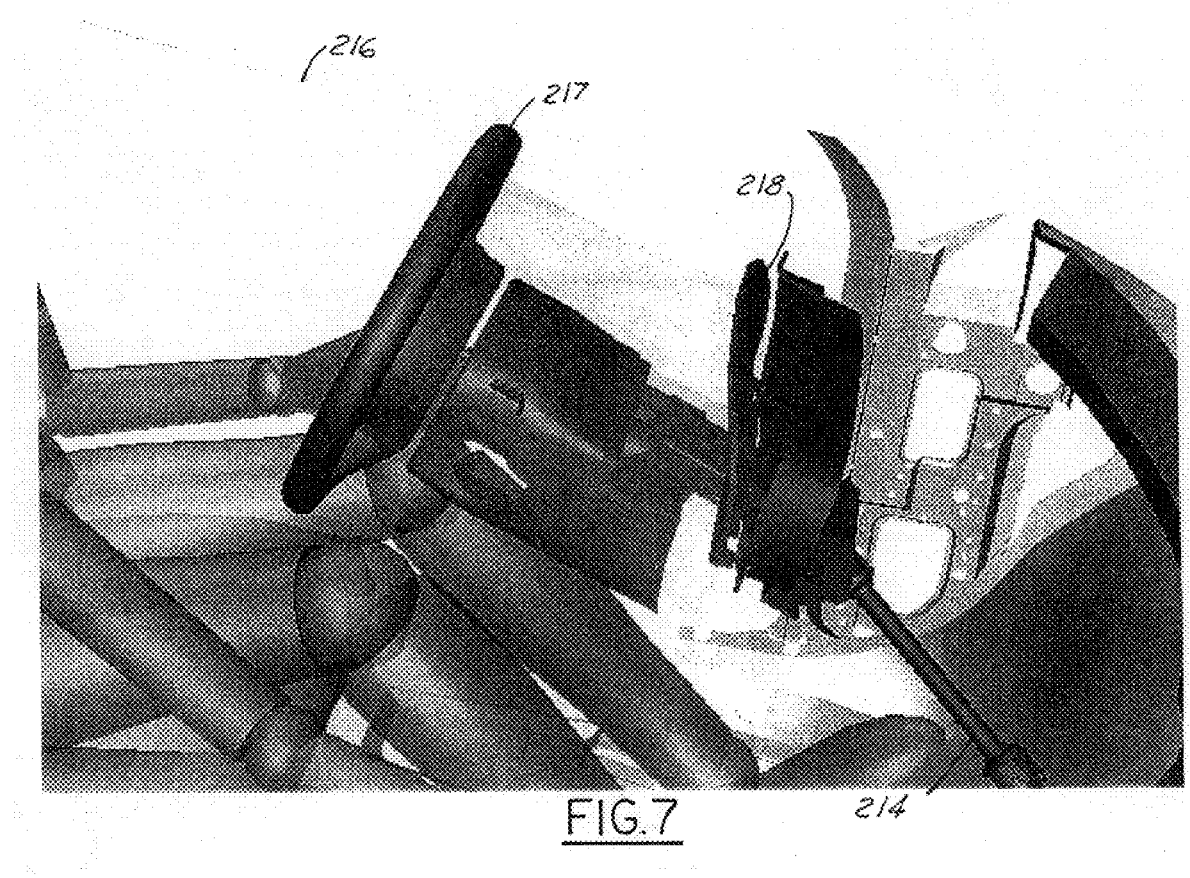
FIG. 7 is a color perspective view showing packaging of a steering wheel, steering column, and instrument cluster according to the present invention.

After the seat 210 has been located, a steering wheel 212 and steering column 214 (shown in green FIG. 7) can be located (box 66 of FIG. 5), but are not necessary for performing the reach studies of the present invention. As with all of the systems packaged by the method of the present invention, the steering wheel and column may be selected from a list of electronic representations of those parts. The steering wheel and column are located such that the occupant in the driver's seat is able to access and easily use the steering wheel 212. An instrument panel cluster may also be packaged, preferably by performing a rimblock study (box 68, FIG. 5) which determines, electronically, a zone which is obstructed from the driver's view in the forward direction. This zone is referred to as a rimblock zone 216 (shown as yellow-green in FIG. 7) and is used for proper placement of an instrument panel cluster (box 70, FIG. 5) containing gauges and other vehicle performance indicating devices. The IP cluster 218 (purple, FIG. 7) is preferably placed out of the rimblock zone 216. Placement of the IP cluster is not necessary to the present invention directed to occupant reach.

Figure 8:
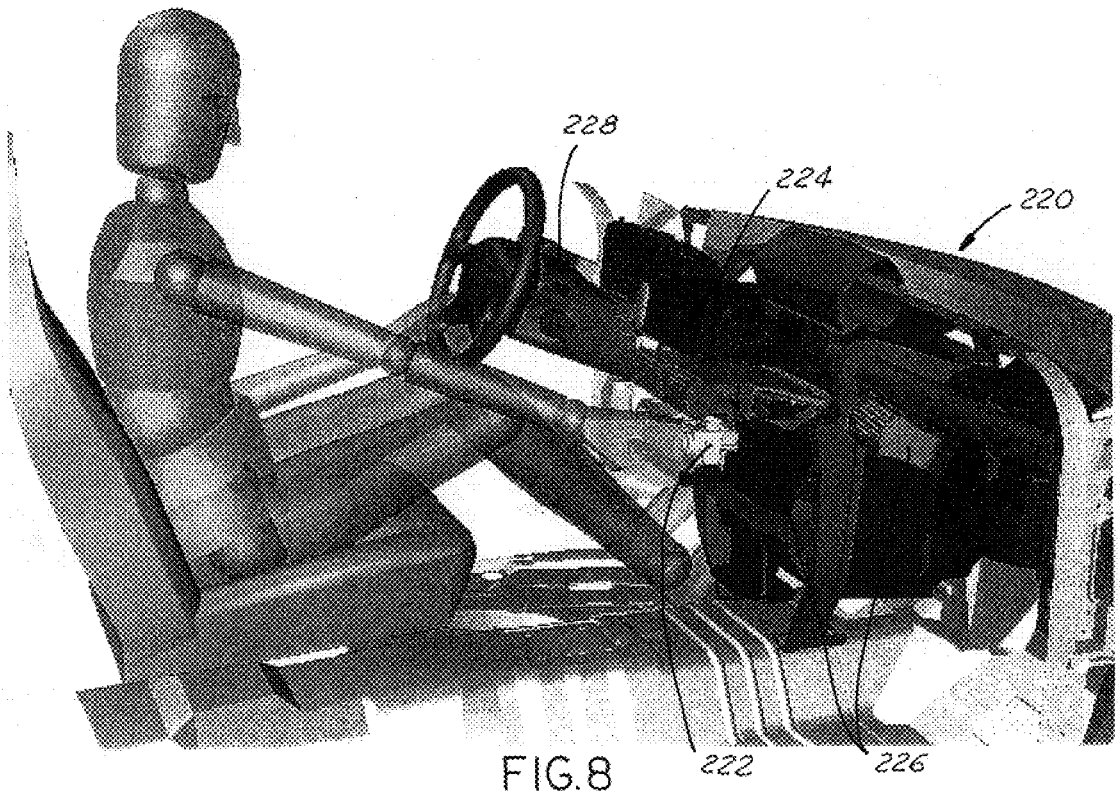
FIG. 8 is a color perspective view showing packaging of various instrument panel components according to the present invention.
Figure 9:
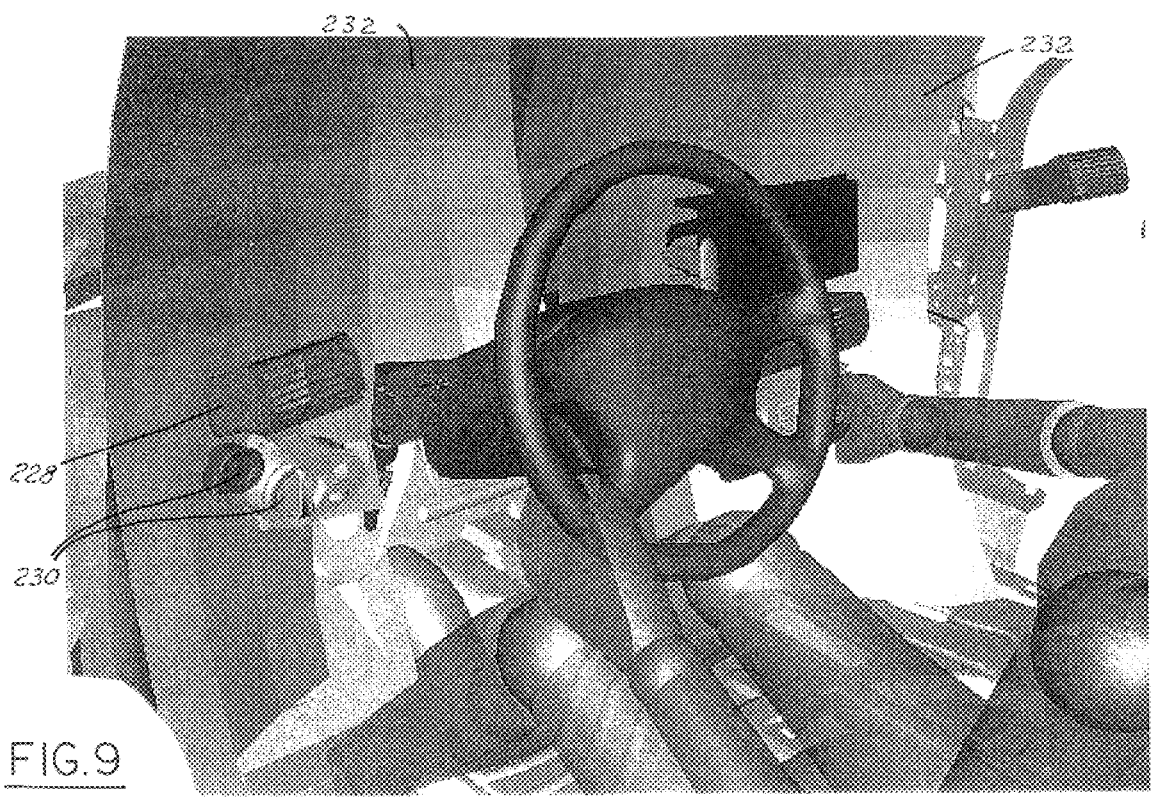
FIG. 9 is a color perspective view of a maximum push-button reach zone for determining occupant interaction with vehicle system.

The center stack components are next packaged (box 72 of FIG. 5). The center stack, generally indicated at 220 (FIG. 8), is that portion of the instrument panel in the center of the vehicle typically containing a panel, or panels, having instrument controls for vehicle audio electronics 222 (light yellow), HVAC controls 224 (black), and the like. The center stack may also contain HVAC outlets 226 (pink). It should also be understood that other HVAC outlets 228 (pink) and instrument panel controls 230 (light yellow and red) may also be packaged during this step of the method of the present invention, for example, lighting controls (light yellow) for both the exterior and interior may be located outboard of the steering column on the instrument panel (FIG. 9). Packaging of these components for purposes of this disclosure means selecting a device, component, or system and electronically representing such in a location proximate other vehicle structure so as not to interfere with adjacent components or structure. If interference is detected during packaging, an appropriate indication is given to the user.

Figure 10:
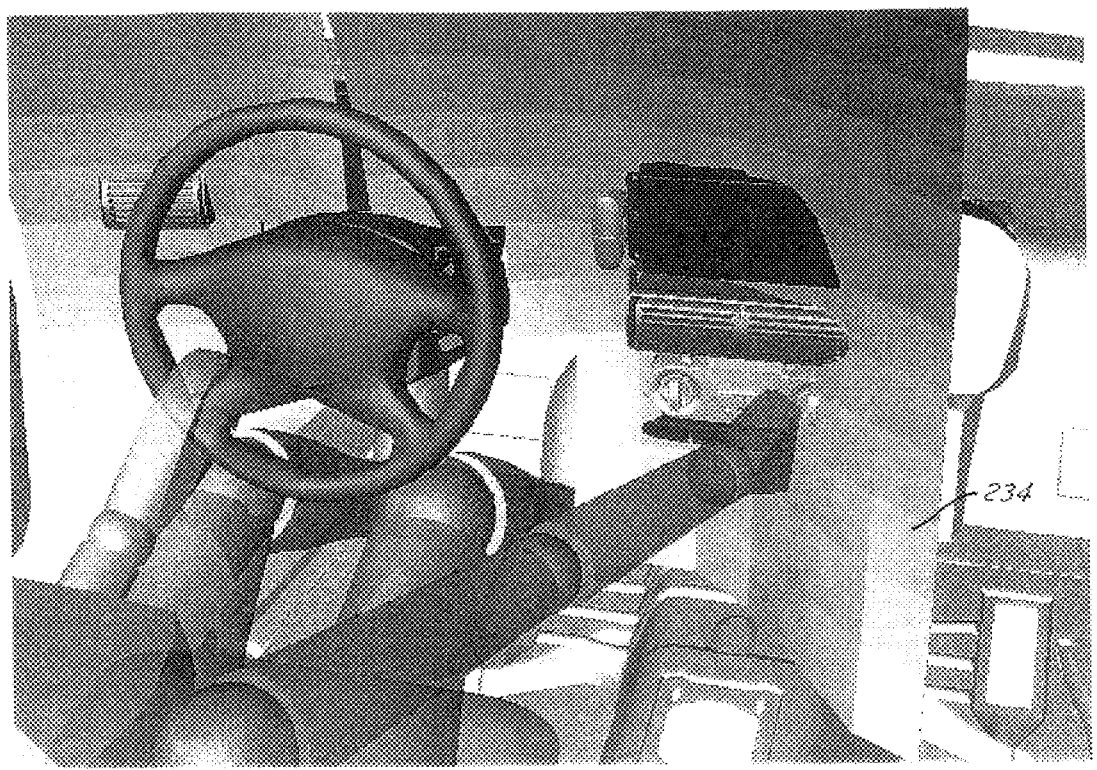
FIG. 10 is a color perspective view showing a maximum 3-finger reach zone.
Figure 11:
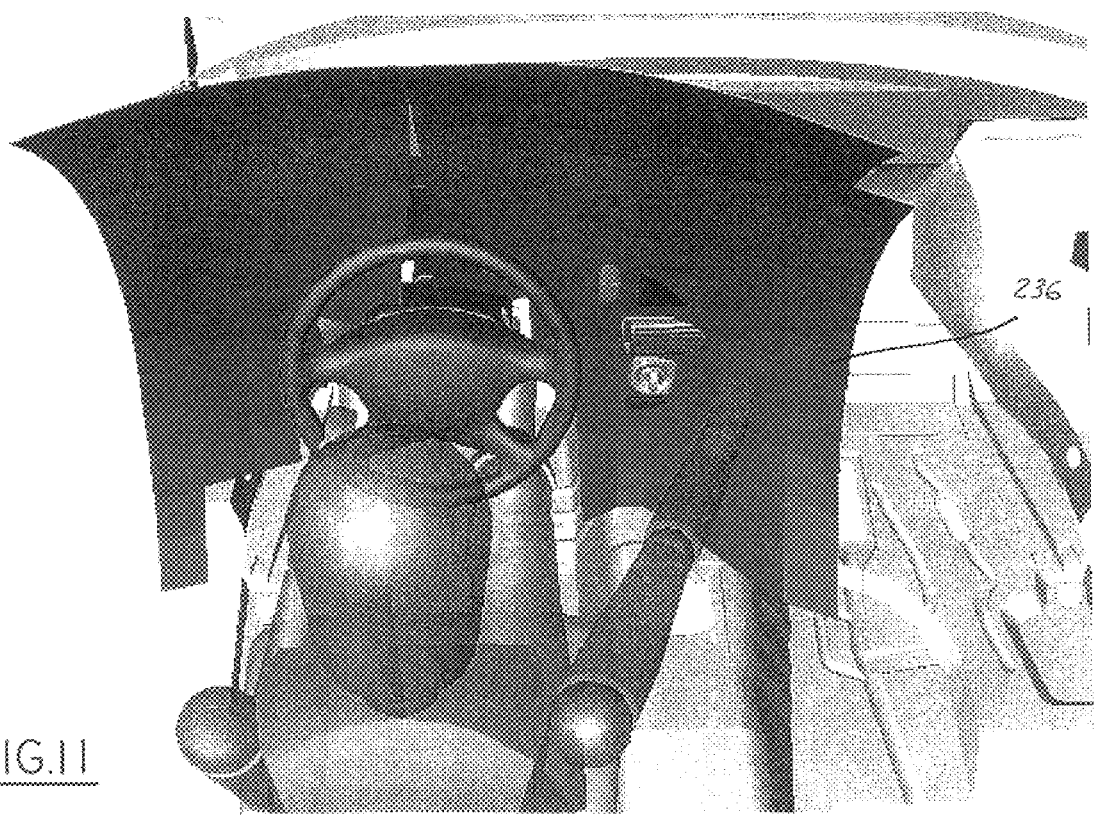
FIG. 11 is a color perspective view showing a full grasp reach zone.

After the instrument panel components, devices, and systems have been packaged, various studies may be electronically performed to determine whether the package is satisfactory from a human factors criteria standpoint. Such studies may include, for example, a maximum reach zone created by a maximum reach surface 232 (various shades of orange and yellow in FIG. 9), a three-finger grasp zone created by a three-finger grasp surface 234 (various shades of green in FIG. 10), and a full grasp zone created by a full grasp surface 236 (various shades of pink in FIG. 11). These surfaces can be created in many ways, for example by using SAE reach data as further described below with respect to the maximum reach study. The surfaces may also be created by sweeping a length, for example representing the length from an occupant shoulder point to the end of the middle finger, through an electronically represented three-dimensional space in front of the occupant representation.

Figure 12:
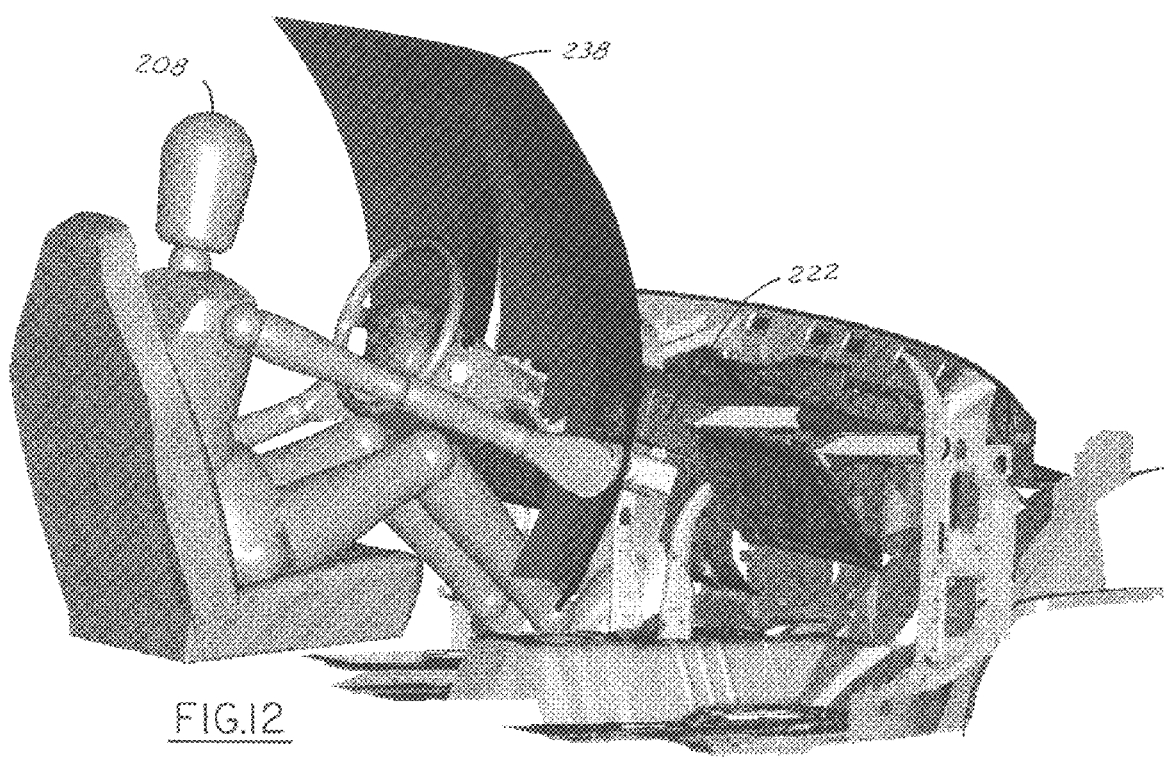
FIG. 12 is a color perspective view of an occupant maximum push button zone showing inaccessibility to a portion of a vehicle system.

Studies yielding the aforementioned zones, and others, provide a designer with information regarding the ergonomic viability of the design. For example, FIG. 12 indicates that an occupant 208 would not be able to reach the radio 222 (dark gray) since part of it is beyond the maximum push button surface 238 (dark red). Objects beyond the maximum push button surface 238, which for purposes of FIG. 12 is toward the right or forward section of the vehicle, are not capable of being pushed by the occupant 208 without leaning forward. The maximum push button surface 238, generated as described above, thus creates a maximum push button zone which a vehicle designer can use for ergonomic placement of vehicle systems, components, or devices. Other reach surfaces can likewise be generated and analysis performed similar to that just described.

Figure 13:
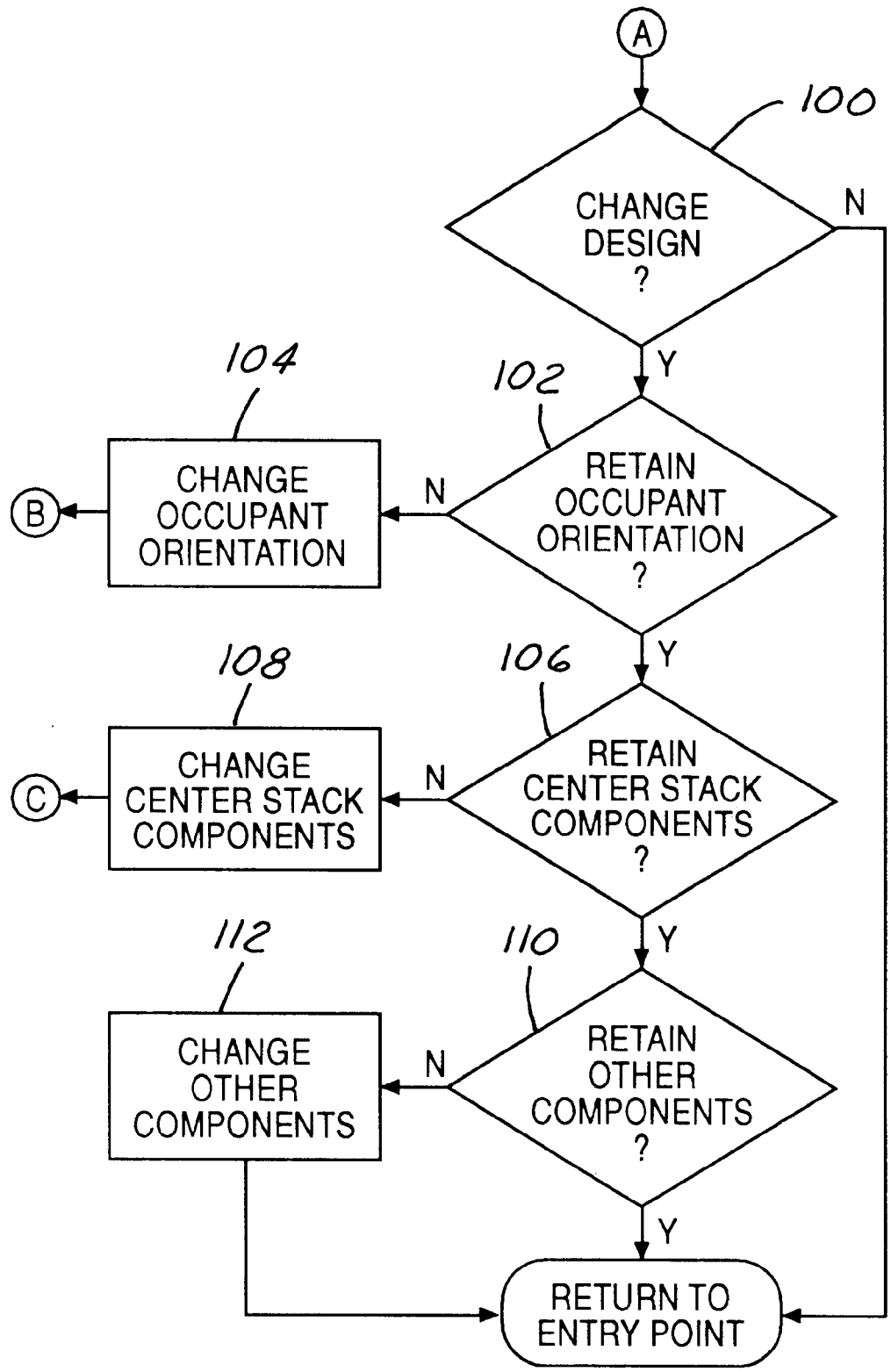
FIG. 13 is a flow chart showing a design change process optionally used with the vehicle design method according to the present invention.

At box 74 in FIG. 5, a maximum push button reach study is performed, similar to that discussed above. Similarly, studies are made for maximum full hand grasp reach (box 76) and maximum three finger reach (box 78). Should the packaging be unacceptable from a human factor perspective, vehicle design alteration may be made. A design alteration determination flow chart, as shown in FIG. 13, may be used to perform changes to vehicle design, if any. In the first decisional diamond 100 of FIG. 13, the desire for design change is questioned. If the decision is made not to change vehicle design despite it not meeting designated human factor criteria, the flow is returned to the entry point from the flow chart in FIG. 5, which may be point designated "A". Such a decision may be made, for example, when non-ergonomic considerations outweigh the desirability of design change for ergonomic reasons.

Figure 14:
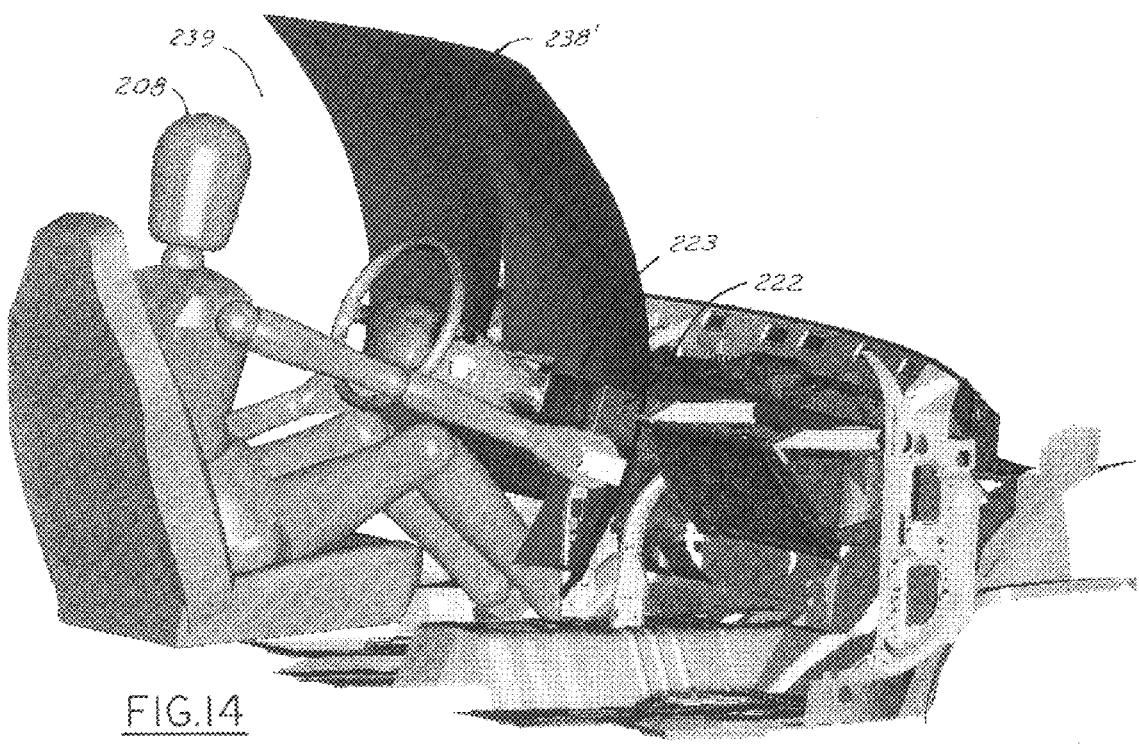
FIG. 14 is a color perspective view similar to FIG. 11 but showing a modified occupant orientation so that the occupant can fully access the push buttons on the vehicle system.

Continuing with FIG. 13, should there be a desire to investigate changing the vehicle design, retention of the current occupant orientation is made in the second decisional diamond 102. If it is determined not to retain the current occupant orientation, then a change is made thereto in box 104, and the flow is returned to entry point B in the flow chart of FIG. 5. For example with reference to FIG. 1, since part of the radio 222 was beyond the maximum push button surface 238 and thus inaccessible by the occupant 208, a designer may decide to reorient the occupant position by movement generally forward, that is, toward the radio. When reorientation of the occupant is done, a new reach surface 238' is generated (FIG. 14), after performing the intermediate steps subsequent to entry point B in FIG. 5. It can be seen from FIG. 14 that the entire front surface 223 of the radio 222 is now on an occupant side of the maximum push button surface 238' indicating that all the radio controls are within the maximum push button zone 239 and thus reachable by an occupant finger.

If it is determined to retain the current occupant orientation, the flow in FIG. 13 moves to the third decisional diamond 106 where it is determined whether to retain the current packaging configuration of the center stack components. If it is determined not to retain these current center stack components, the change is made in box 108 and the flow is returned to entry point C in the flow chart of FIG. 5. It should be noted that, in the examples of FIGS. 12 and 14, a change to the packaging arrangement of the radio 222, alone or in conjunction with a change to the occupant orientation, may be made meet the maximum push button criteria. However, if it is determined to retain the current packaging of the center stack components, the flow in FIG. 13 goes to the fourth decisional diamond 110 wherein it is determined to retain other vehicles components. If it is determined not to retain other vehicle components, then those components, or a subset thereof, are changed in box 112 and the flow returns to the entry point in the flow chart of FIG. 5, that is, the point in FIG. 5 which routed decisional flow to FIG. 13. However, if it is determined to retain the other vehicle components, then flow is returned to entry point A in the flow chart of FIG. 5 without any changes having been made to the vehicle design. It should be understood that the just described vehicle design change flow chart of FIG. 13 is optional and that the method and system of the current invention need not employ such a design change method or means for accomplishing such. It should further be noted that there are numerous possibilities for design change flow chart logic, and that FIG. 13 is meant to be illustrative and not limiting.

Figure 15:
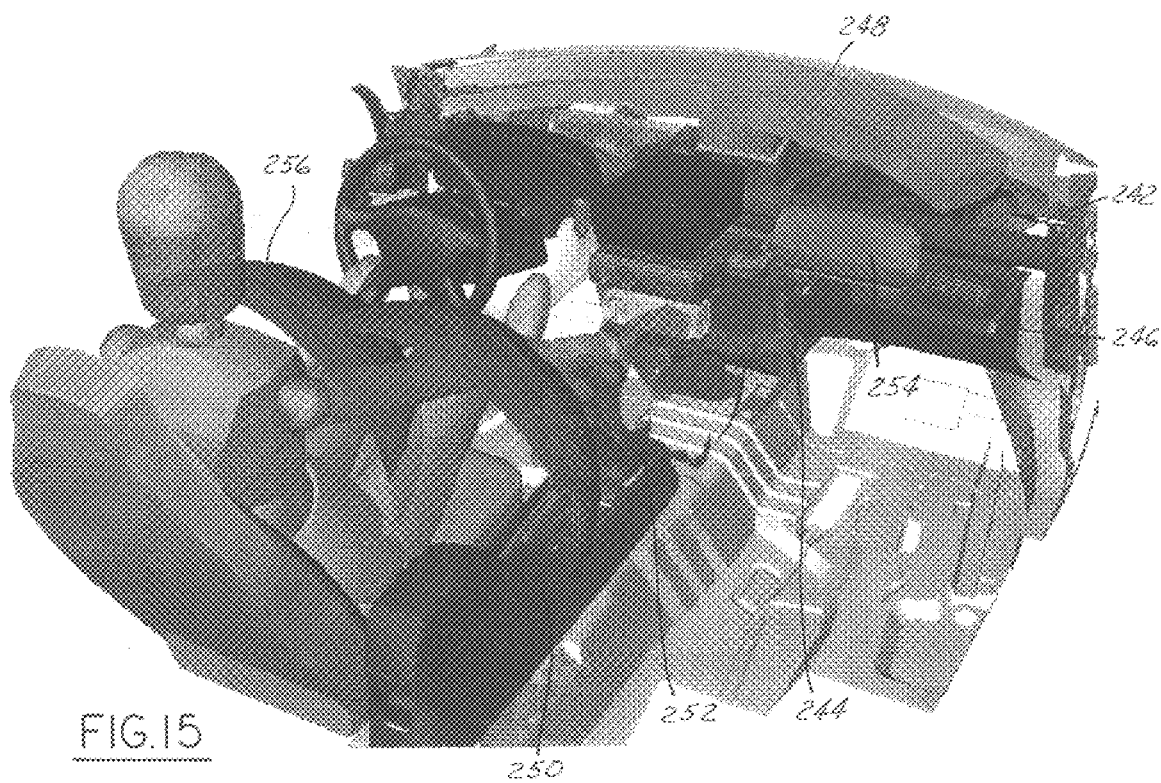
FIG. 15 is a color perspective view showing a minimum reach zone.
Figure 16A:
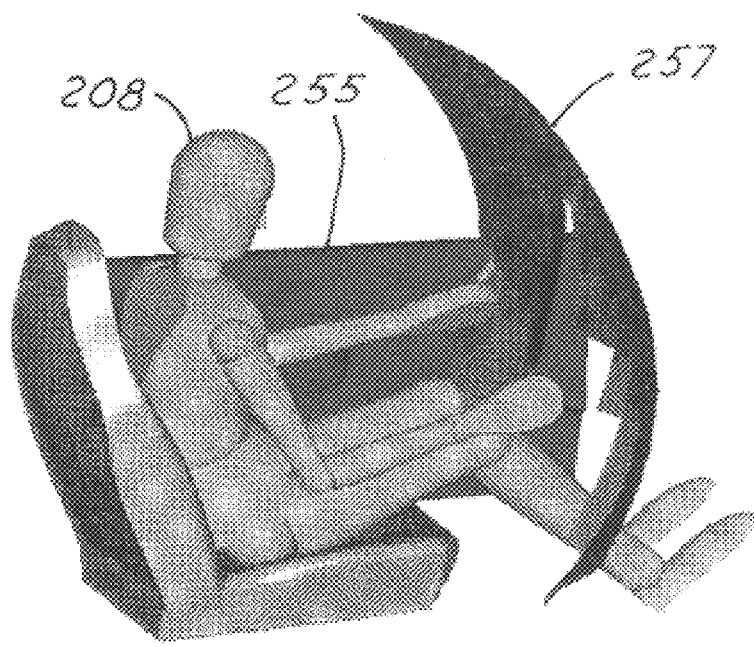
FIG. 16A is a color perspective view showing an occupant maximum reach zone with respect to vehicle door trim.
Figure 16B:
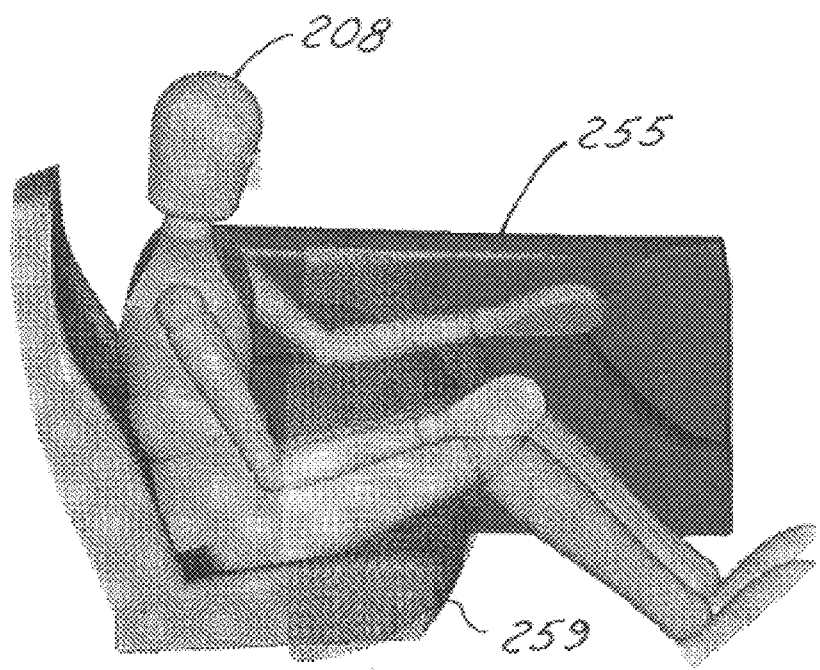
FIG. 16B is a color perspective view showing an occupant minimum reach zone with respect to vehicle door trim.

In box 80 (FIG. 5), additional vehicle structure is added, including but not limited to, a cross car beam 242 and support brackets 244, a glove box 246, a windshield cowl 248, a center console 250, a manual gear shifter 252, an air bag 254 (FIG. 15), and a door 255 (FIGS. 16A and 16B). These items, in electronic form, are taken either from vehicle design data, or from the standard parts library data 10, and are referenced to the common reference point, or coordinate system, in three-dimensional electronic form. In decisional diamond 82, if the console reach zone is unacceptable, then a design change flow as described above with reference to FIG. 13 is followed. Part of the determination of whether the console reach zone is acceptable includes generation and comparison of a minimum reach zone 256 (FIG. 15) to a predetermined minimum reach criteria, for example, the criteria that a vehicle system cannot be within a prescribed distance from the occupant. It should be understood that the present invention is not limited to driver reach, but can also be applied to human factors reach reach studies for front and rear seat occupants.

In addition, if the door trim reach is not satisfactory from either a maximum three finger reach or a minimum reach perspective (decisional diamond 84 in FIG. 5), then a design change flow as described above with reference to FIG. 13 is followed. To make these determinations, reach studies are performed as described above. A maximum three finger reach surface 257 (blue, FIG. 16A) is generated and compared, visually or otherwise, to the location of controls, such as window controls, door latch controls, and mirror controls. Controls forward of the blue surface 257, that is toward the right in FIG. 16A, will be difficult to operate with three fingers and the designer has the option of making a design change. However, if the controls are between the blue surface 257 and the occupant 208, then three finger reach is satisfactory. Additionally, a minimum reach surface 259 (green, FIG. 16B) is generated and compared, visually or otherwise, to aforementioned controls. Controls rearward of the green surface 259, that is between the occupant and the surface in FIG. 17B, will be awkward to maneuver and the designer has the option of making a design change. Door trim controls forward the green surface 259 are acceptable from a minimum reach perspective. After completion of the reach studies, the process is completed in terminal 86.

Figure 17:
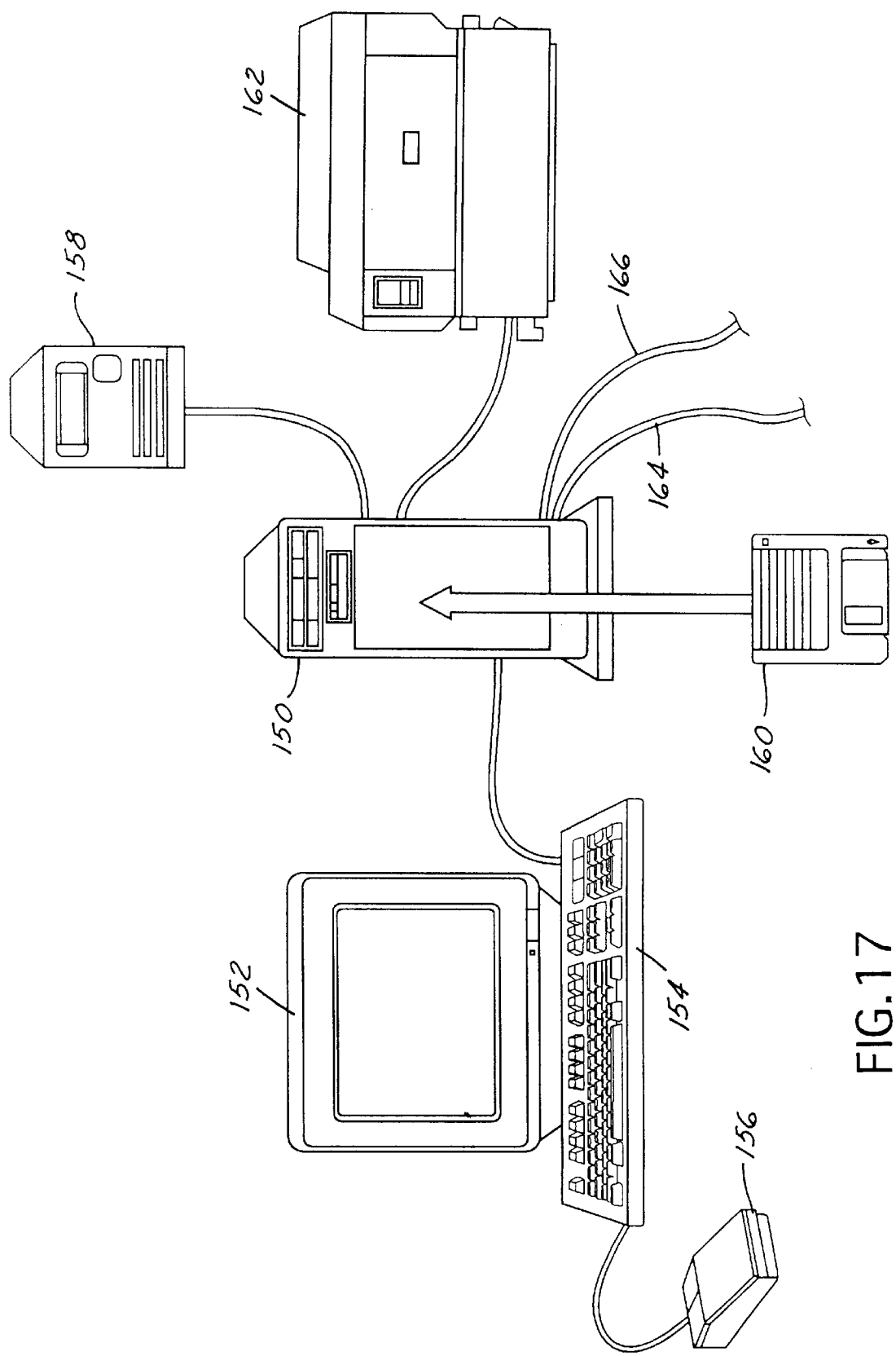
FIG. 17 is a view of a system for designing a portion of an automotive vehicle according to the present invention.

A representative system for occupant based vehicle design according to the present invention is depicted in FIG. 17. The system includes a processing unit 150 connected to a user interface which may include a display terminal 152, a keyboard 154, a pointing device, such as a mouse, 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media 160, such as a removal disk, sometimes called a floppy disk, optical media 158, or the like. In a preferred embodiment, the system includes a general purpose computer program to implement the functions illustrated and described with reference to FIGS. 1–16B. Of course, a system according to the present invention could also be embodied with a dedicated device which includes various combinations of hardware and software. The preferred embodiment may also include a printer 162 connected to the processing unit 150, as well as a network connection for accessing a local server, an intranet 164, and the Internet 166. Preferably, solid modeling software, parametric design software, surface rendering software, animation software, and the like are used for developing a system according to the present invention.

Figure 18:
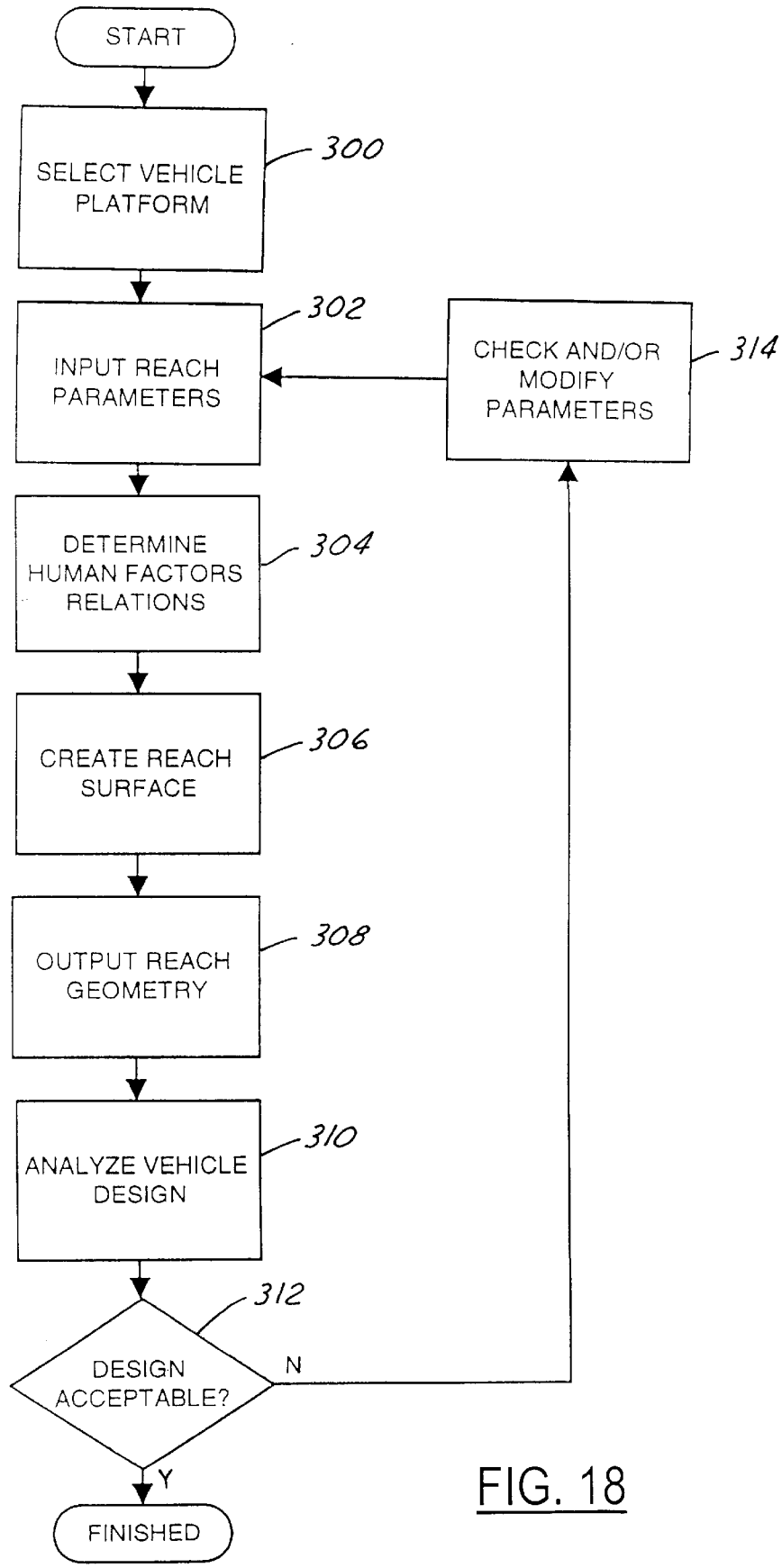
FIG. 18 is a flowchart showing a method for vehicle design using occupant reach surfaces according to the present invention.

A method for vehicle design using occupant reach surfaces according to the present invention is shown in FIG. 18. Beginning in box 300, a vehicle platform is selected as described above. In box 302, various reach parameters are input into the system. Preferably, a set of default input reach parameters are available which can be modified by a vehicle designer to meet design specifications. These input reach parameters may include, for example, an occupant hip point (H point), a heel point, which may be located by a vertical distance (H30) from the H point and a horizontal distance (L53) from the H point, a foot angle on the accelerator (L47, angle Theta), the steering wheel outer diameter (W9), the steering wheel angle from the vertical (H18), a back angle (L40), a horizontal distance from the heel point to the center of the steering wheel (L11), a distance from the heel point to the center of the steering wheel (H17), and an angle between the torso of an occupant and the upper leg of the occupant (L42). Those skilled in the art will recognize that some of the input reach parameters may be standard SAE parameters. Other input parameters may also be defined to further refine the occupant reach studies of the present invention.

Referring now to box 304 of FIG. 18, various human factors relations are determined after the input reach parameters have been identified. For example, a "G" factor is determined which is essential for creating a hand-reach plane. The hand-reach plane is used in creating a reach surface (box 306), as is further described below. In box 308, the reach surface geometry is output. That is, the reach surface geometry is electronically oriented within the vehicle. In box 310, the vehicle design is analyzed with respect to the reach surface. In the decision diamond 312, if the design is acceptable, then the process for the particular reach study is finished. However, if the design is not acceptable, then the flow branches from the decision diamond 312 to the box 314 in which the input reach parameters are checked to determine if they are satisfactory, and/or the input parameters are modified. The flow then returns to box 302 in which the modified parameters are input to the method and system of the present invention, and the process flow continues as just described above.

Figure 19:
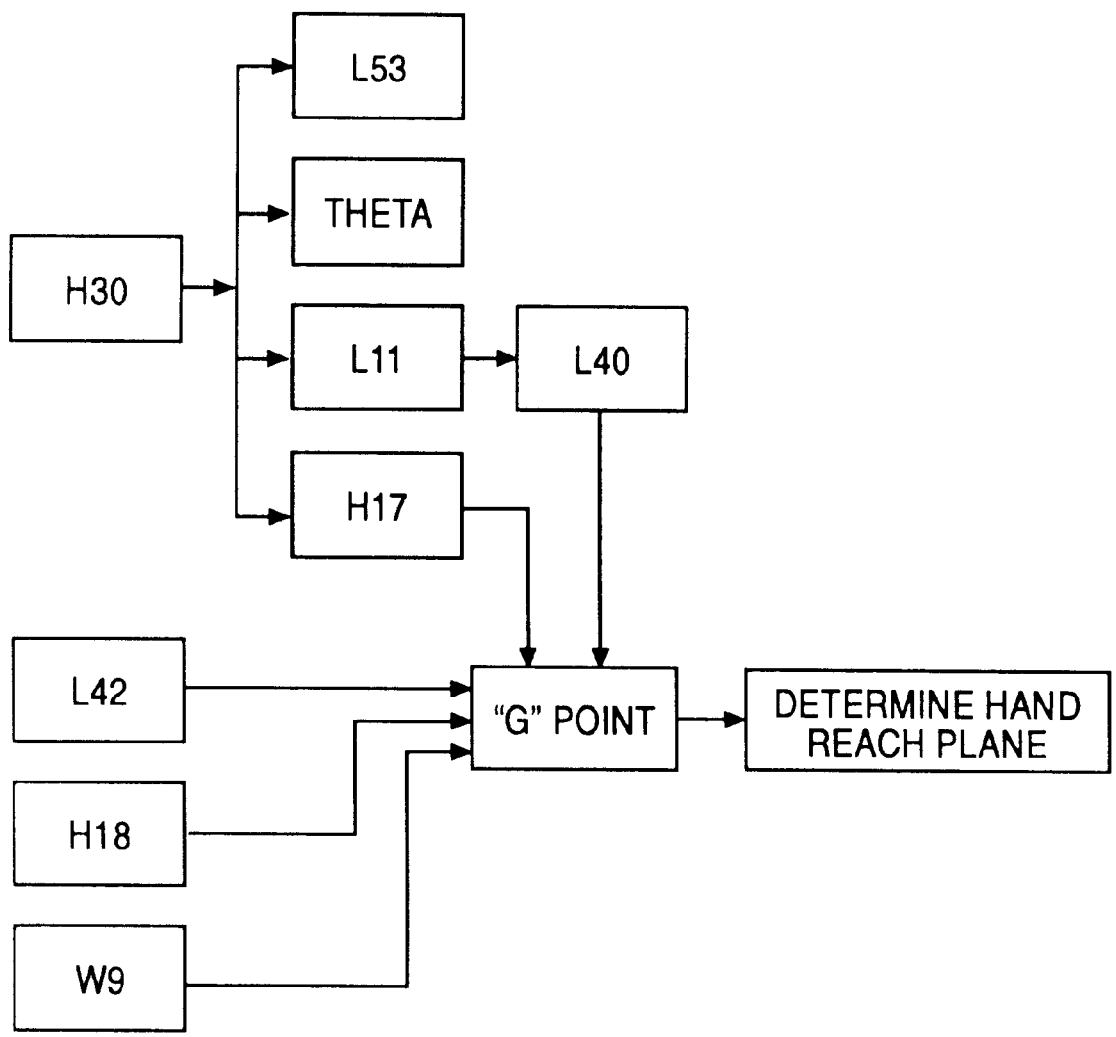
FIG. 19 is a relationship flowchart showing determination of a G-factor for use in creating an occupant maximum reach surface.

Determination of the "G" factor, which is used to create a hand-reach plane, is shown graphically in FIG. 19. Various input reach parameters, including H17, L40, L42, H18, W9, L11 and H30, may be required to determine the "G" factor. An equation for determining the "G" factor is as follows:

$$G=F_1*H30+F_2*L40+F_3*W9+F_4*H18+F_5*L11+F_6*H17+F_7*L42+F_8$$

where $F_1=0.0018$, $F_2=-0.0197$, $F_3=0.0027$, $F_4=0.0106$, $F_5=-0.0011$, $F_6=0.0024$, $F_7=0.0027$, and $F_8=-3.0853$. These factors may vary depending on the particular hand reach plane desired. The "G" factor can be used to determine the hand-reach (HR) plane location as follows:

$$HR=786-99*G$$

where HR is the hand reach plane location in a fore-aft direction of the electronically represented vehicle, and G is the G factor described above. This equation is experimentally determined. Those skilled in the art will understand that various formulations of the "G" factor and the "HR" plane location may be used, depending on expected driver populations, and other such factors.

Figure 20:
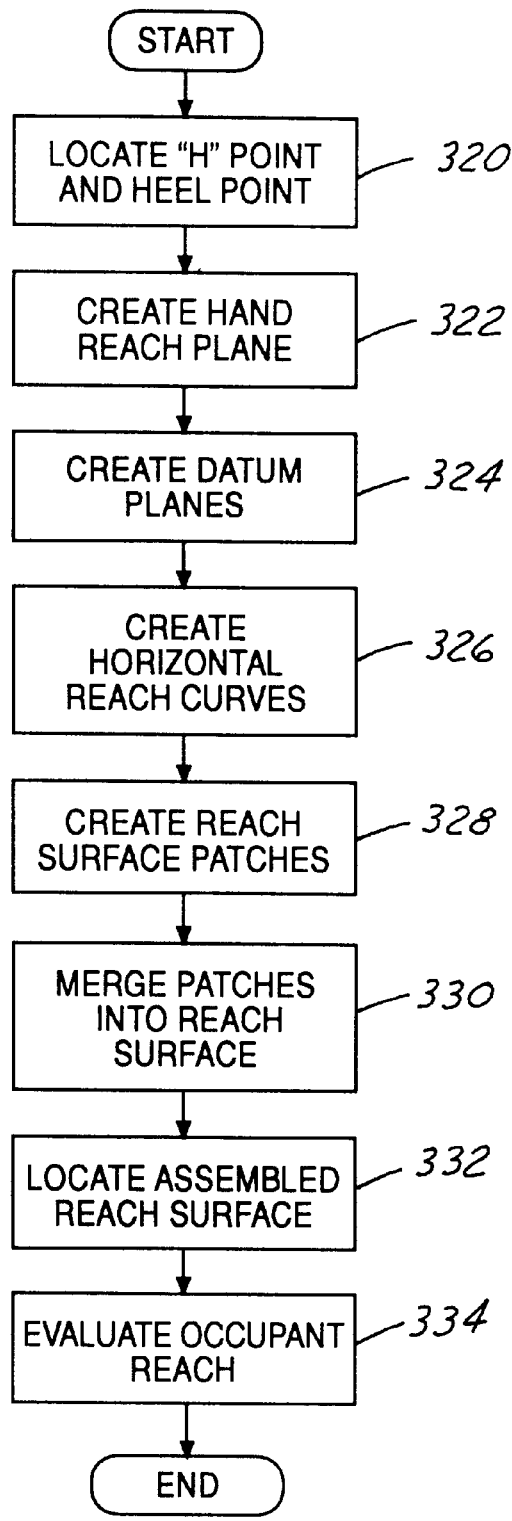
FIG. 20 is a flowchart showing creation of an occupant maximum reach surface for use in a human factors reach study according to an embodiment of the present invention.
Figure 21:
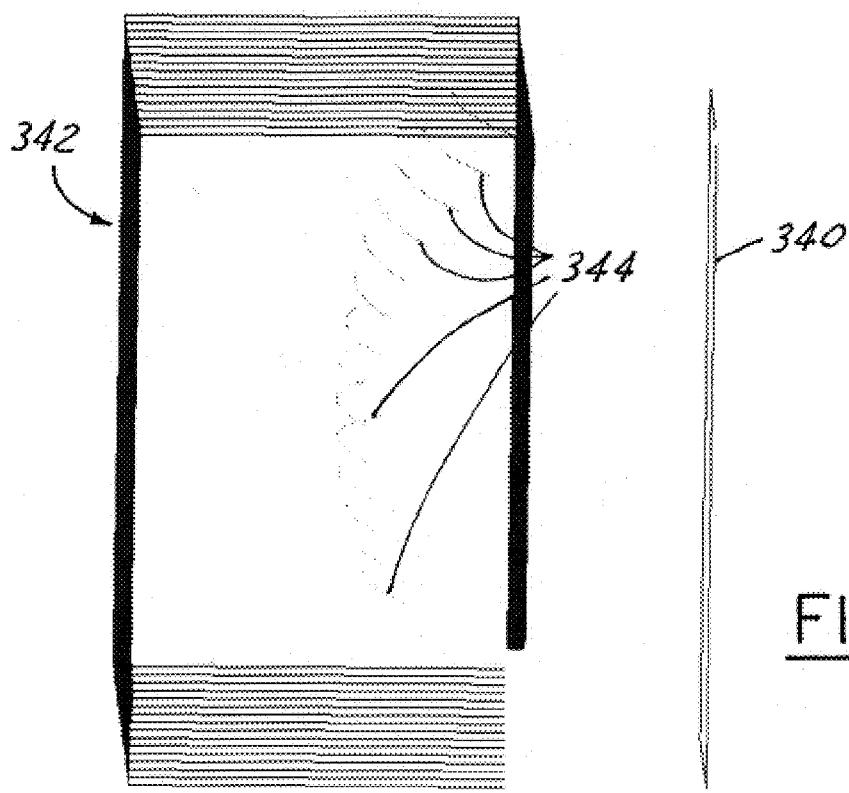
FIG. 21 is a color perspective view of a hand reach plane, a series of datum planes, and a series of horizontal curves used in constructing an occupant maximum reach surface.
Figure 22:
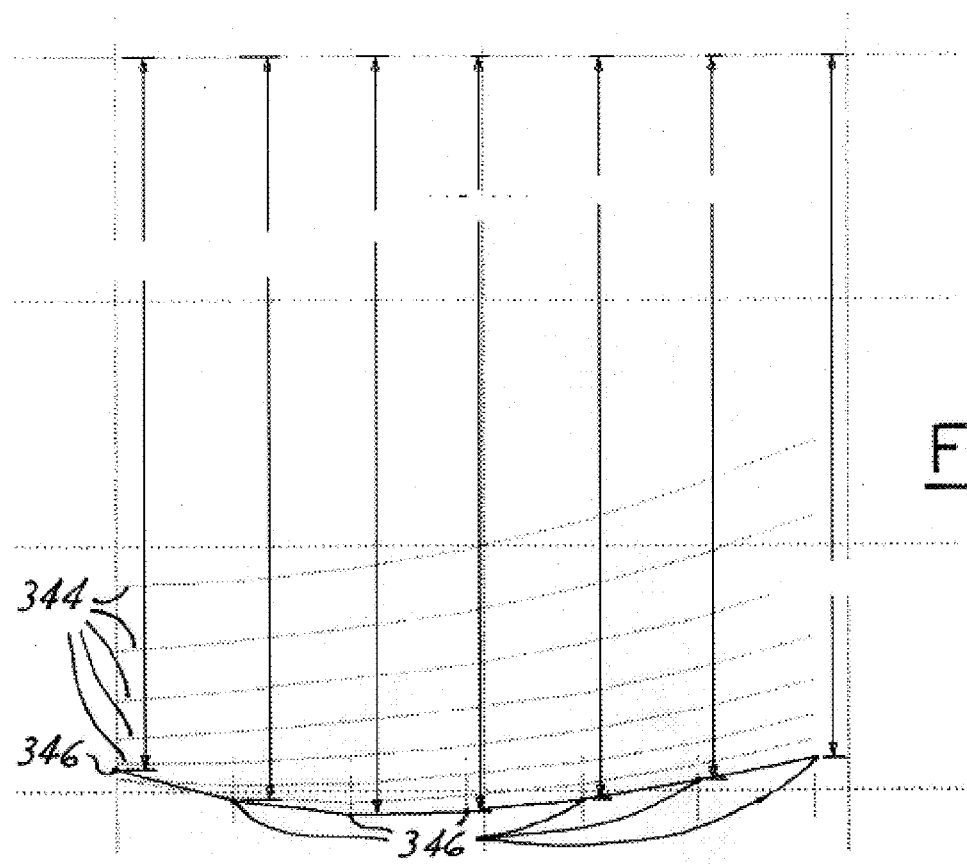
FIG. 22 is a top view of a series of horizontal curves and a set of predetermined distances between a hand reach plane and the horizontal curves for constructing an occupant maximum reach surface.

Turning now to FIG. 20, creation of an occupant maximum-reach zone will be described. There are many such occupant reach zones which may be used in the method and system of the present invention, it being understood that the surface creation shown in FIGS. 20–26 are illustrative only and that the present invention is not limited to that shown in those drawings. Beginning then with box 320 of the FIG. 20, the "H" point and the heel point are located with reference to the common coordinate system used for the vehicle platform, as described above. Next, in box 322, a hand-reach plane is created, such as generally indicated at 340 in FIG. 21. The hand-reach plane is located using the "G" factor described above with reference to the common coordinate system of the vehicle platform. In box 324, a set of equally spaced coplanar datum planes, generally indicated at 342 in FIG. 21, are placed directly forward of the hand-reach plane 340. For purposes of FIG. 21, forward is to the left of the HR plane 340. The width of the datum planes 342 can be varied to match the width of the HR plane 340, the width of the HR plane being dependent on the breadth of vehicle systems which are to be evaluated for occupant reach.

Figure 23:
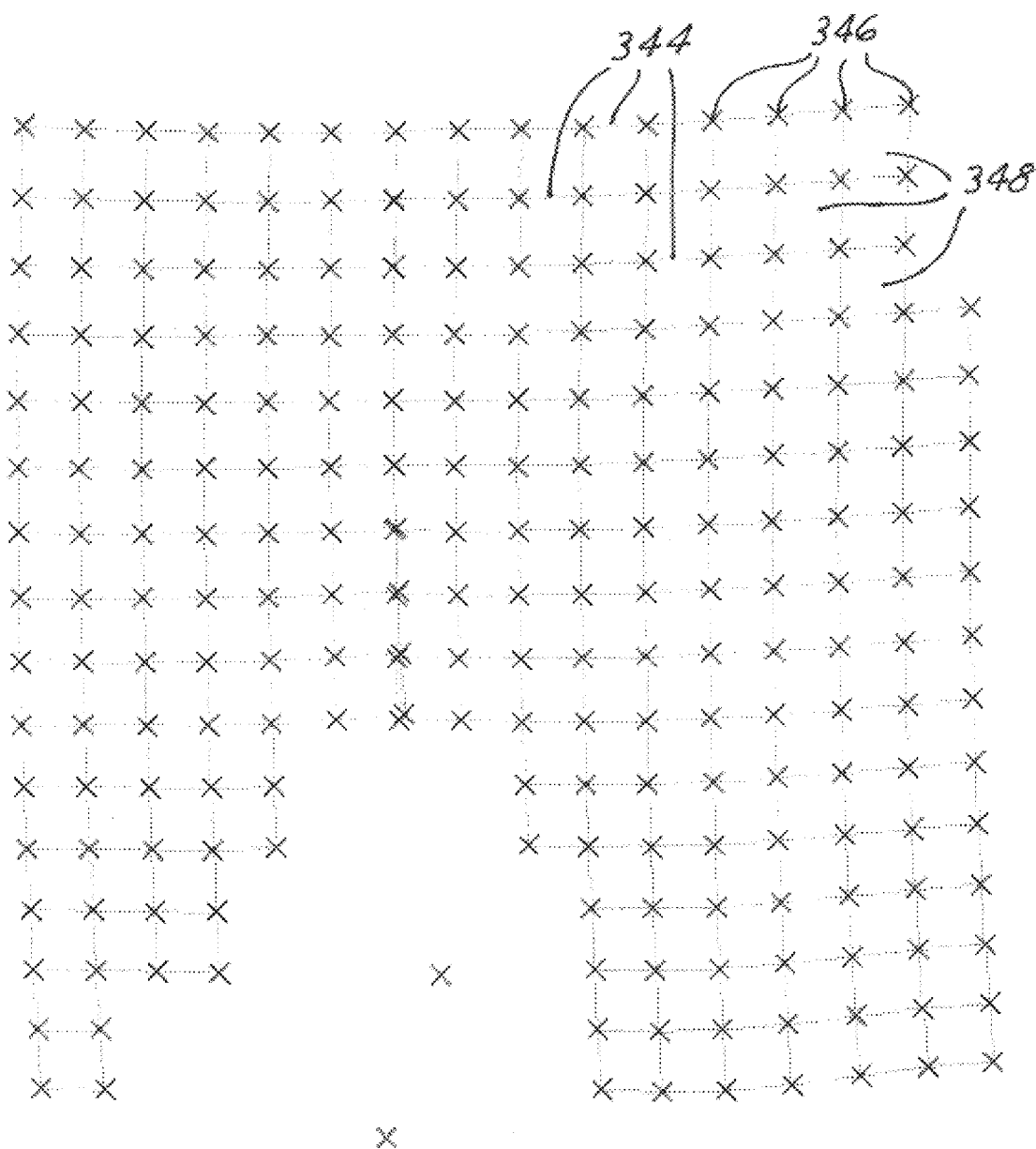
FIG. 23 is a front view of a grid of patches representing a maximum occupant reach surface.
Figure 24:
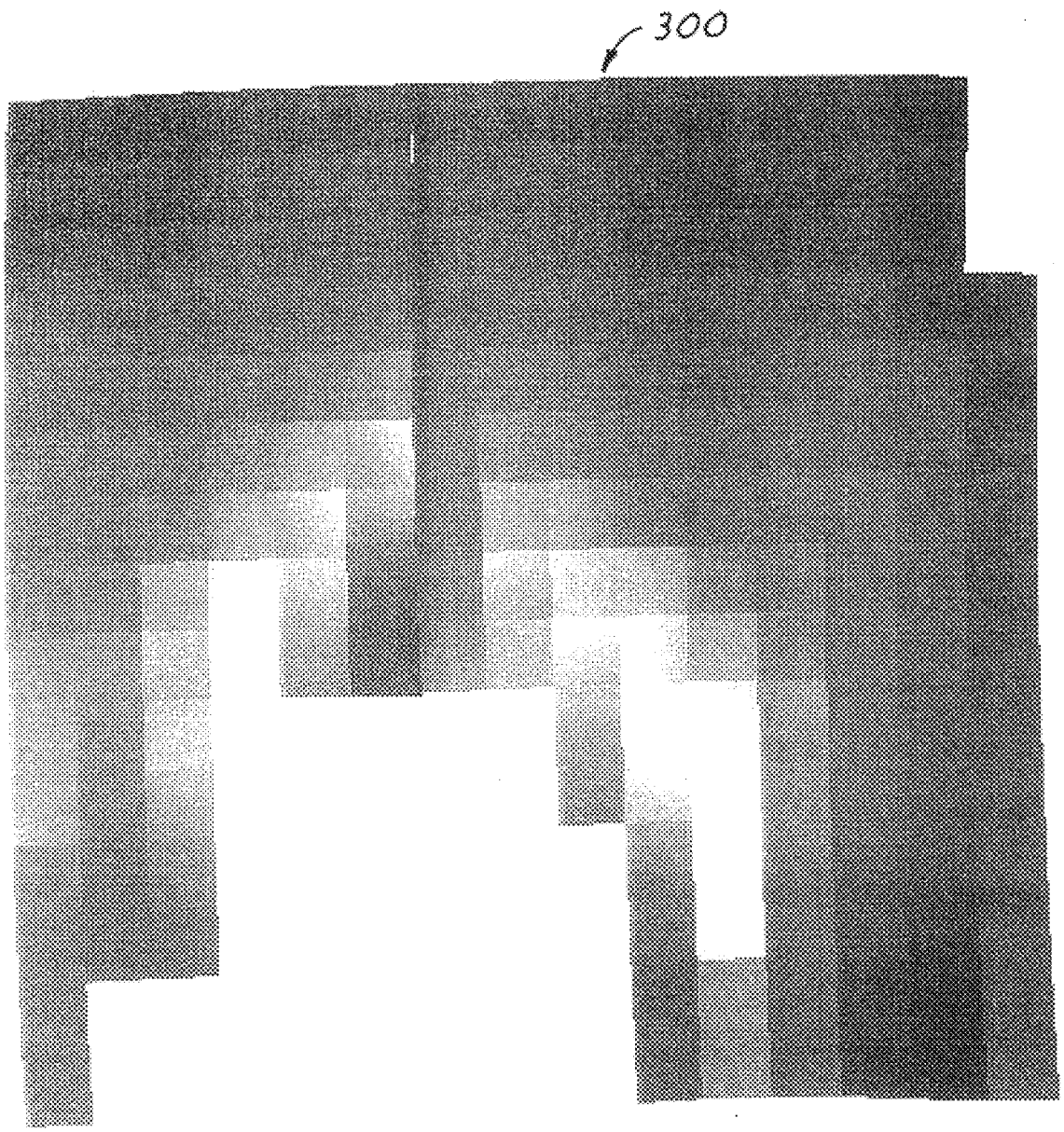
FIG. 24 is a front view similar to FIG. 23 but showing the grid patches colored blue to represent the entire occupant maximum reach surface.
Figure 25:
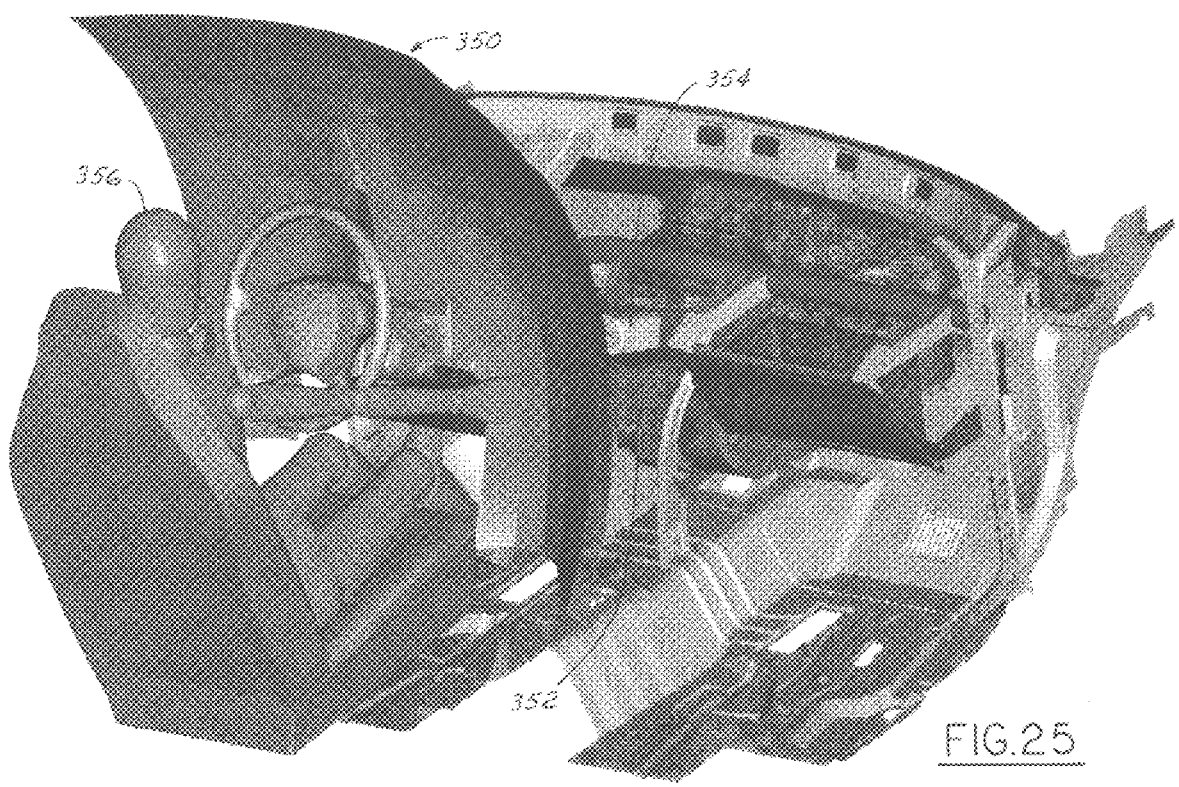
FIG. 25 is a color perspective view showing placement of the occupant maximum reach surface with respect to an occupant representation and a portion of a vehicle, the occupant maximum reach zone indicating inaccessibility to a portion of a vehicle system.
Figure 26:
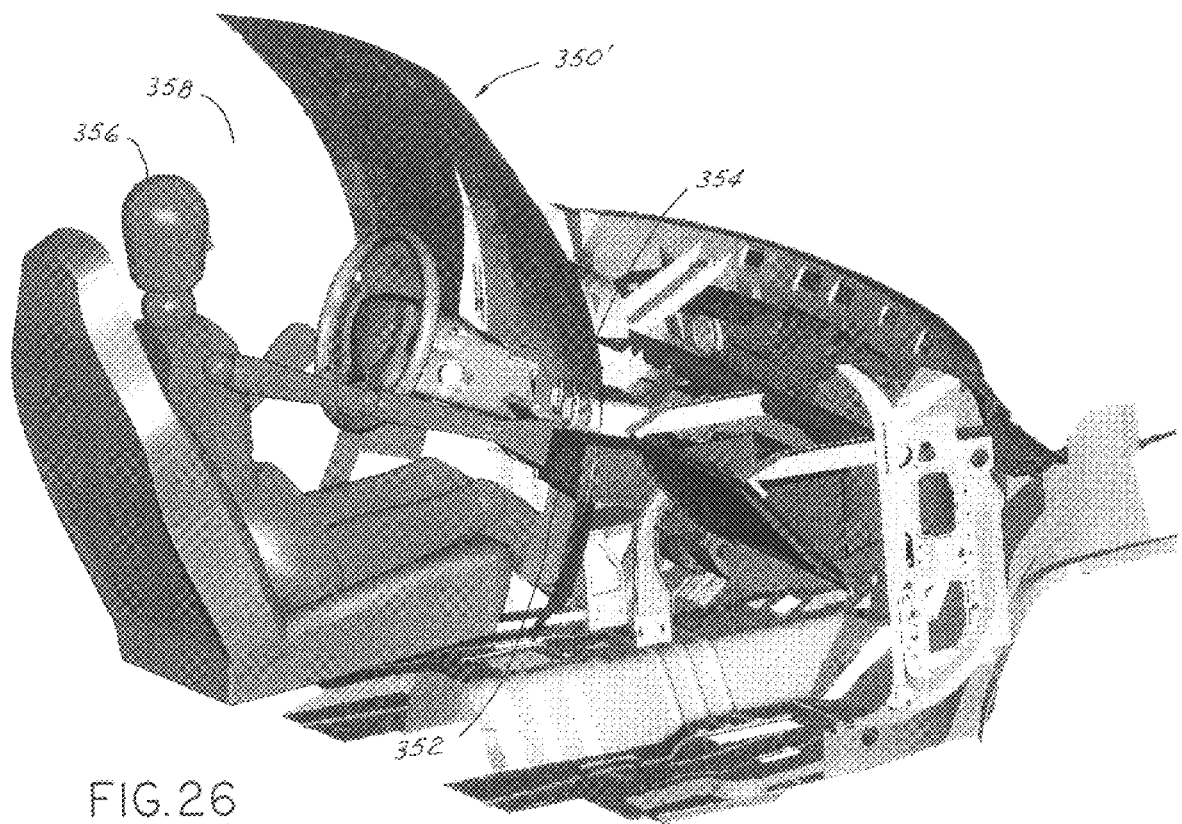
FIG. 26 is a color perspective view similar to FIG. 25 but showing a modified occupant orientation so that the occupant can fully reach center stack controls on the vehicle system.

Still referring to FIG. 20, a series of horizontal reach curves 344 (FIG. 21) are created to represent the intersection of predetermined distances from the HR plane 340 with the datum planes 342. In box 328, reach surface patches are created by identifying vertical reach points 346 (FIG. 22) at intersections with the horizontal curves 344. As best seen in FIG. 23, this resulting intersection provides a grid-like series of adjacent reach surface patches 348. These patches 348 are then merged into a reach surface 350 (FIG. 24) in box 330 (FIG. 20). In box 332 of FIG. 20, the assembled reach surface 350 is then electronically located within the vehicle platform, as shown in FIG. 25. In box 334 of FIG. 20, the occupant reach is evaluated. It can be seen in FIG. 25 that the center stack components, including the radio 352 and the HVAC controls 354, are beyond the maximum reach surface 350, and thus outside the maximum reach zone so as to be inaccessible by the occupant 356. A variation of occupant orientation, for example, moving the occupant in a forward direction, likewise moves the maximum reach surface 350 in a forward direction such that the HVAC controls 354 and the radio 352 are moved within the occupant side 358 of the maximum reach surface 350 so that the occupant 356 is able to reach them (FIG. 26).

The method and system of the present invention may be used for a wide variety of occupant reach related tasks and is not limited to that shown in FIGS. 2–17B. The present invention is meant to encompass a vehicle design method and system in a computer environment for allowing a vehicle designer to determine occupant reach interaction between computer electronic representations of the occupant and the vehicle, or systems on the vehicle, and to report the outcome of such a study to the vehicle designer. The invention can be used to conduct human factors ergonomic reach studies for both right and left hand drive vehicles.

Various human factor reach studies may be performed in addition to, or in place of, those described above. Studies which may be performed include optimum back angle, preferred steering wheel center, arm rest surface zone, torso angle, G-factor for use with reach zone generation, manual transmission stick shift hand clearance zone, optimum neutral shift location and variation plane, and hand recommended pattern and spacing curves for stick shift location for each gear position from the optimal neutral location.

As seen in the foregoing list, there are numerous human factor studies which may be conducted to provide a vehicle designer with information for enhancing vehicle ergonomics. The present invention is not, of course, limited to those studies described above as the list is meant to be illustrative and not limiting.

While the form of the invention shown and described herein constitutes a preferred embodiment of the invention, it is not intended to illustrate all possible forms thereof. The words used are of description rather than limitation, and various changes may be made without departing from the spirit and scope of the invention as disclosed.

We claim:

1. A method for designing an automotive vehicle in a computer system in which a portion of a vehicle, an occupant representation, and at least one occupant interactive vehicle surface are electronically represented, the method comprising the steps of:
    (a) orienting the occupant representation within a passenger compartment in the vehicle;
    (b) positioning the at least one occupant interactive vehicle surface within the passenger compartment;
    (c) generating at least one occupant reach surface based upon a predetermined occupant reach criteria; and
    (d) displaying said at least one surface so as to divide the passenger compartment into at least one occupant reach zone.

2. A method for designing an automotive vehicle according to claim 1 wherein the occupant representation is oriented using a predefined set of occupant orientation parameters.

3. A method for designing an automotive vehicle according to claim 2 wherein the predefined set of occupant orientation parameters include at least one of the following:
    an occupant hip point;
    a distance between an accelerator heel point and the occupant hip point; and
    an occupant back angle.

4. A method for designing an automotive vehicle according to claim 1 wherein the at least one occupant interactive vehicle surface is defined in an electronically stored parts library.

5. A method for designing an automotive vehicle according to claim 1 wherein the predetermined occupant reach criteria comprise a set of human reach factors.

6. A method for designing an automotive vehicle according to claim 5 wherein the set of human reach factors comprise at least one of a maximum push button criteria, a maximum three-finger grasp criteria, a maximum full grasp criteria, a steering wheel finger reach criteria, and minimum reach criteria.

7. A method for designing an automotive vehicle according to claim 1 wherein the at least one occupant reach surface comprises at least one of a maximum push button surface, a maximum three-finger grasp surface, a maximum full grasp surface, a minimum reach surface, and a steering wheel finger surface.

8. A method for designing an automotive vehicle according to claim 1 wherein the at least one occupant reach zone comprises at least one of a maximum push button zone, a maximum three-finger grasp zone, a maximum full grasp zone, a minimum reach zone, and a steering wheel finger zone.

9. A method for designing an automotive vehicle according to claim 1 and further including the step of repositioning the at least one occupant interactive vehicle surface within the passenger compartment after step (d) based upon a predefined set of rules.

10. A method according to claim 9 wherein the predefined rules comprise a set of locational relationships between each of the at least one occupant interactive vehicle surfaces and adjacent occupant interactive vehicle surfaces and the portion of the vehicle electronically represented.

11. A computer aided method for designing an interior of an automotive vehicle having a passenger compartment in which an occupant representation and at least one vehicle component are electronically represented, the method comprising the steps of:
    (a) providing a three-dimensional electronic reference frame for an interior portion of the vehicle;
    (b) selecting a location for the at least one vehicle component within the passenger compartment in the reference frame;
    (c) orienting the occupant representation within the passenger compartment;
    (e) generating at least one occupant reach surface based upon a predetermined occupant reach criteria between the occupant representation and the at least one vehicle component; and
    (f) displaying the at least one reach surface so as to divide the passenger compartment into at least one occupant reach zone.

12. A method for designing an automotive vehicle according to claim 11 wherein the occupant representation is oriented using a predefined set of occupant orientation parameters comprising at least one of the following:
    an occupant hip point;
    a distance between an accelerator heel point and the occupant hip point; and
    an occupant back angle.

13. A method for designing an automotive vehicle according to claim 11 wherein the at least one vehicle component is defined in an electronically stored parts library.

14. A method for designing an automotive vehicle according to claim 11 wherein the predetermined occupant reach criteria comprise a set of human reach factors comprising at least one of a maximum push button criteria, a maximum three-finger grasp criteria, a maximum full grasp criteria, a minimum reach criteria, and a steering wheel finger reach criteria.

15. A method for designing an automotive vehicle according to claim 11 wherein the at least one occupant reach surface comprises at least one of a maximum push button surface, a maximum three-finger grasp surface, a maximum full grasp surface, a minimum reach surface, and a steering wheel finger surface.

16. A method for designing an automotive vehicle according to claim 11 wherein the at least one occupant reach zone comprises at least one of a maximum push button zone, a maximum three-finger grasp zone, a maximum full grasp zone, a minimum reach zone, and a steering wheel finger zone.

17. A method for designing an automotive vehicle according to claim 11 and further including the step of repositioning the at least one occupant interactive vehicle surface within the passenger compartment after step (d) based upon a set of locational relationships between each of the at least one vehicle components and adjacent vehicle components and the interior portion of the vehicle.

18. A computer aided method for designing an interior of an automotive vehicle in which an occupant representation and at least one occupant interactive system are electronically represented, the method comprising the steps of:

(a) orienting the occupant representation within the interior of the vehicle;

(b) positioning at least one occupant interactive system in a system position within the interior;

(c) generating at least one occupant-system geometric representation based upon a spatial relationship between the occupant representation and the at least one occupant interactive system; and (d) varying the system position of the at least one occupant interactive system so as to meet a predetermined occupant-system interaction criteria.

19. A method for designing an automotive vehicle according to claim 18 wherein the occupant representation is oriented using a predefined set of occupant orientation parameters comprising at least one of the following:

an occupant hip point;

a distance between an accelerator heel point and the occupant hip point; and an occupant back angle.

20. A method for designing an automotive vehicle according to claim 18 wherein the at least one occupant interactive system is defined in an electronically stored parts library.

21. A method for designing an automotive vehicle according to claim 18 wherein the at least one occupant-system geometric representation comprises at least one of a maximum push button surface, a maximum three-finger grasp surface, a maximum full grasp surface, a minimum reach surface, and a steering wheel finger surface.

22. A method for designing an automotive vehicle according to claim 18 wherein the predetermined occupant-system interaction criteria comprise a set of human reach factors including at least one of a maximum push button criteria, a maximum three-finger grasp criteria, a maximum full grasp criteria, a minimum reach criteria, and a steering wheel finger reach criteria.

23. A computer aided method for designing a portion of an interior of an automotive vehicle in which an occupant position and at least one vehicle device are electronically represented, the method comprising the steps of:

(a) selecting a value for the at least one occupant position parameter;

(b) determining a spatial relationship between the at least one occupant position parameter and the at least one vehicle device;

(c) comparing the spatial relationship to a predetermined criteria; and (d) determining a locational change for the at least one vehicle device so that the spatial relationship meets the predetermined criteria.

24. A method for designing an automotive vehicle according to claim 23 wherein the occupant parameters at least one of the following:

an occupant hip point;

a distance between an accelerator heel point and the occupant hip point; and an occupant back angle.

25. A method for designing an automotive vehicle according to claim 23 wherein the at least one vehicle device is defined in an electronically stored parts library.

26. A method for designing an automotive vehicle according to claim 18 wherein the predetermined criteria comprise a set of human reach factors including at least one of a maximum push button criteria, a maximum three-finger grasp criteria, a maximum full grasp criteria, a minimum reach criteria, and a steering wheel finger reach criteria.

27. A method for designing an automotive vehicle according to claim 23 and further including the step of repositioning the at least one vehicle device within the interior based upon the locational change.

28. A method for designing an automotive vehicle according to claim 27 wherein the locational change is partially determined by a set of locational relationships between each of the at least one vehicle device, adjacent vehicle devices, and the interior portion of the vehicle.

29. A computer aided method for designing an instrument panel of an automotive vehicle, the method comprising the steps of:

(a) providing a three-dimensional vehicle reference frame for a portion of the vehicle;

(b) packaging at least one integrated system within the instrument panel in the vehicle reference frame;

(c) positioning at least one occupant interactive vehicle surface within a vehicle passenger compartment in the vehicle reference frame;

(d) orienting an occupant representation within the passenger compartment;

(e) generating at least one human factors reach surface based upon a predetermined human factors reach criteria between the occupant representation, the at least one occupant interactive vehicle surface, and the at least one integrated system; and (f) displaying said at least one surface so as to divide the passenger compartment into a plurality of occupant zones.

30. A method for designing an automotive vehicle according to claim 29 wherein the at least one integrated system is packaged in step (b) by:

selecting a vehicle part having a plurality of part parameters from a vehicle parts library;

generating an initial part geometry based upon the part parameters and a generic part architecture; and generating a modified part geometry by changing at least one part parameter of the vehicle part to modify the initial part geometry.

31. A computer aided method for designing an interior portion of an automotive vehicle, the method comprising the steps of:

(a) selecting a set of generic parameters for describing an occupant position in the interior portion of the vehicle and occupant interaction with respect to at least one device within the vehicle;

(b) selecting a value for each of the set of generic parameters;

(c) generating a spatial relationship between the occupant position and the at least one occupant device; and (d) determining a parameter change for at least one of the set of generic parameters so that the spatial relationship meets a predetermined criteria.

32. A method for designing an automotive vehicle according to claim 31 and further including the steps of generating and displaying at least one occupant reach surface based upon the spatial relationship so as to divide the passenger compartment into a plurality of occupant reach zones.

33. A computer aided method for designing a portion of an automotive vehicle, the method comprising the steps of:

(a) storing in the memory of a computer system a first set of data representing an occupant position within the vehicle;

(b) storing in the memory a second set of data representing a position for at least one occupant interactive vehicle system within the passenger compartment;

(c) generating a third set of data representing a reach distance between the first set of data and the second set of data;

(d) comparing the third set of data to a fourth set of data representing a predetermined occupant reach criteria; and (e) varying the second set of data until the third set of data meets the predetermined occupant reach criteria.

34. A method for designing an automotive vehicle according to claim 33 wherein the first set of data includes data representing at least one of the following:

occupant hip point data;

data representing a distance between an accelerator heel point and the occupant hip point; and occupant back angle data.

35. A method for designing an automotive vehicle according to claim 33 wherein the second set of data includes data from an electronically stored parts library.

36. A method for designing an automotive vehicle according to claim 33 wherein the fourth set of data comprises human reach factors data.

37. A method for designing an automotive vehicle according to claim 36 wherein the human reach factors data comprises data from at least one of a set of maximum push button data, a set of maximum three-finger grasp data, a set of maximum full grasp data, a set of minimum reach data, and a set of steering wheel finger reach data.

38. A method for designing an automotive vehicle according to claim 33 wherein the second set of data is varied in step (e) based upon a predefined set of rules.

39. A method according to claim 38 wherein the predefined rules comprise a set of locational relationships between the first and second sets of data.

40. A method for designing an automotive vehicle according to claim 33 including the step of generating a fifth set of data representing at least one occupant reach surface based upon the third set of data representing the reach distance.

41. A method for designing an automotive vehicle according to claim 40 wherein the fifth set of data includes at least one of a maximum push button surface, a maximum three-finger grasp surface, a maximum full grasp surface, a minimum reach surface, and a steering wheel finger surface.

42. A method for designing an automotive vehicle according to claim 40 including the step of displaying the fifth set of data relative to the first and second sets of data.

43. A method for designing an automotive vehicle according to claim 40 wherein the fifth set of data is displayed so as to divide the passenger compartment into at least one of a maximum push button zone, a maximum three-finger grasp zone, a maximum full grasp zone, a minimum reach zone, and a steering wheel finger zone.

44. A computer aided method for designing a portion of an automotive vehicle, the method comprising the steps of:

(a) storing in the memory of a computer system a first set of data representing an occupant position within the vehicle;

(b) storing in the memory a second set of data representing a position for at least one occupant interactive vehicle system within the passenger compartment;

(c) generating a third set of data representing a spatial relationship between the first set of data and the second set of data;

(d) comparing the third set of data to a fourth set of data stored in the memory representing a predetermined occupant-vehicle interaction criteria; and (e) varying the second set of data until the third set of data meets the predetermined occupant-vehicle interaction criteria.

45. A system for designing a portion of an automotive vehicle, the system comprising:

(a) first code means for representing an occupant position within a passenger compartment in the vehicle;

(b) second code means for representing a position for at least one occupant interactive vehicle system within the passenger compartment;

(c) third code means for generating a spatial relationship between the occupant position and the at least one occupant interactive vehicle system;

(d) fourth code means for comparing the spatial relationship to a predetermined occupant-vehicle interaction criteria; and (e) fifth code means for varying the position of the at least one occupant interactive system to meet the predetermined occupant-vehicle interaction criteria.

46. A system according to claim 45 wherein the first code means includes at least one of the following:

code means for representing an occupant hip point;

code means for representing a distance between an accelerator heel point and the occupant hip point; and code means for representing an occupant back angle.

47. A system according to claim 45 wherein the second code means includes code means for representing a parts library.

48. A system according to claim 45 wherein the predetermined occupant-vehicle interaction criteria comprises a set of human factors reach data.

49. A system according to claim 48 wherein the human factors reach data comprises data from at least one of a set of maximum push button data, a set of maximum three-finger grasp data, a set of maximum full grasp data, a set of minimum reach data, and a set of steering wheel finger reach data.

50. A system according to claim 45 wherein the fifth code means includes a set of locational rules between the first and second code means.

51. A system according to claim 45 including sixth code means for displaying the spatial relationship between the occupant position and the at least one occupant interactive vehicle system.

52. A system according to claim 51 wherein the sixth code means causes the spatial relationship between the occupant position and the at least one occupant interactive vehicle system to be displayed so as to divide the passenger compartment into at least one of a maximum push button zone, a maximum three-finger grasp zone, a maximum full grasp zone, a minimum reach zone, and a steering wheel finger zone.

53. A computer aided vehicle design system for designing a portion of an automotive vehicle, the system comprising:

(a) parameter selection code means for selecting a value for at least one occupant position parameter;

(b) spatial code means for determining a reach distance between the at least one occupant position parameter and at least one vehicle device;

(c) comparison code means for comparing the reach distance to a predetermined reach criteria; and (d) adjustment code means for determining a locational change for the at least one vehicle device so that the reach distance meets the predetermined reach criteria.

54. A system according to claim 53 wherein the adjustment code means includes code means for varying a device location of the at least one vehicle device with respect to the at least one occupant position parameter based upon a set of predefined rules.

55. A system according to claim 54 wherein the predefined rules are defined by locational code means comprising a set of locational relationships between each of the at least one vehicle devices.

56. A system according to claim 55 wherein the locational code means comprises a standard parts library electronically stored in a computer memory.

57. A system according to claim 53 wherein the predetermined reach criteria are embodied in a human factors reach code means.

58. A system according to claim 57 wherein the human factors reach code means includes at least one of a maximum push button code means, a maximum three-finger grasp code means, a maximum full grasp code means, a minimum reach code means, and a steering wheel finger code means.

59. A system according to claim 53 including display means for displaying a geometric representation of the reach distance between the occupant representation and the at least one vehicle device.

60. A system according to claim 59 wherein the geometric representation is a surface which divides the passenger compartment into at least two zones.

61. A vehicle design system on a computer in which an occupant representation and at least one vehicle system have a common reference point, the system comprising:
    occupant representation means for orienting an occupant representation with respect to the common reference point in the computer;
    vehicle system representation means for representing in the computer at least one vehicle system with reference to the common reference point;
    reach study means for performing at least one human factors reach study between the occupant representation and the at least one vehicle system; and
    outcome communication means for reporting an outcome of the at least one human factors reach study.

62. A vehicle design system on a computer having processor and a memory in which an occupant and at least one vehicle system are electronically represented with respect to a common reference point in a three-dimensional representation of a portion of a vehicle, the system comprising:
    occupant representation code means for orienting an occupant representation with respect to the common reference point in the computer;
    vehicle system representation code means for representing the at least one vehicle system with reference to the common reference point;
    reach study code means for causing the processor to perform at least one human factors reach study between the occupant representation and the at least one vehicle system; and
    outcome communication code means for reporting an outcome of the at least one human factors reach study.

63. An occupant accessible instrument panel for an automotive vehicle made by:
    (a) orienting an occupant representation within a passenger compartment of the vehicle;
    (b) determining a spatial relationship between the occupant representation and each of at least one of a group of systems having a system location on the instrument panel vehicle;
    (c) comparing the spatial relationship of each of the at least one of the group of systems to a predetermined criteria;
    (d) varying the system location of each of the at least one of the group of systems with respect to the occupant representation based upon a set of predefined rules; and
    (e) performing steps (b) through (d) until the spatial relationship meets the predetermined criteria so that the instrument has systems which are accessible by an occupant in the vehicle.

64. A method for vehicle design on a computer having processor and a memory in which an occupant and at least one vehicle system are electronically represented with respect to a common reference point in a three-dimensional representation of a portion of a vehicle, the method comprising the steps of:
    orienting an occupant representation with respect to the common reference point in the computer;
    representing the at least one vehicle system with reference to the common reference point;
    determining at least one occupant reach interaction between the occupant representation and the at least one vehicle system; and
    reporting the at least one occupant reach interaction.

65. A method according to claim 64 wherein the occupant reach interaction is determined based on a set of human factors reach criteria.

66. A method for designing an automotive vehicle according to claim 65 wherein the set of human factors reach criteria comprise at least one of a maximum push button criteria, a maximum three-finger grasp criteria, a maximum full grasp criteria, a minimum reach criteria, and a steering wheel finger reach criteria.

67. A method according to claim 64 wherein the occupant reach interaction is reported by displaying a geometric reach representation of the occupant interaction between the occupant representation and the at least one vehicle device.

68. A method according to claim 67 wherein the geometric reach representation is a surface which divides the passenger compartment into at least two reach zones.

69. A method according to claim 64 including the step of rendering a three-dimensional surface for the occupant reach representation, each of the at least one vehicle devices, and the portion of the vehicle.

70. A method according to claim 64 including the step of animating movement of the occupant reach representation, at least one vehicle device, and the portion of the vehicle.

71. A method according to claim 65 including the step of determining a locational change for the at least one vehicle device, the occupant representation, or both, so that the occupant reach interaction meets the predetermined reach criteria.

72. A method according to claim 71 including the step of varying a device location of the at least one vehicle device with respect to the common reference point so that the occupant reach interaction meets the predetermined reach criteria.

73. A method according to claim 65 including the step of varying a device representation of the at least one vehicle device so that the occupant reach interaction meets the predetermined criteria.

74. A method according to claim 73 wherein the device representation is selected from an electronically stored standard parts library.

75. A method according to claim 71 including the step of regenerating a vehicle design after making the locational change by changing at least one effected dimension of one of the at least one vehicle systems and the portion of the vehicle as required by the locational change.

76. A method according to claim 75 including the step of automatically selecting parts from an electronic parts library as a substitute for at least one vehicle system to meet a vehicle system change required by the locational change.

* * * * *